(12) United States Patent
Vrudhula et al.

(10) Patent No.: US 8,832,614 B2
(45) Date of Patent: Sep. 9, 2014

(54) TECHNOLOGY MAPPING FOR THRESHOLD AND LOGIC GATE HYBRID CIRCUITS

(71) Applicants: Sarma Vrudhula, Chandler, AZ (US); Niranjan Kulkarni, Phoenix, AZ (US)

(72) Inventors: Sarma Vrudhula, Chandler, AZ (US); Niranjan Kulkarni, Phoenix, AZ (US)

(73) Assignee: Arizona Board of Regents, a body corporate of the State of Arizona, acting for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/903,424

(22) Filed: May 28, 2013

(65) Prior Publication Data

US 2013/0339914 A1  Dec. 19, 2013

Related U.S. Application Data

(60) Provisional application No. 61/651,659, filed on May 25, 2012.

(51) Int. Cl.
*G06F 17/50* (2006.01)
*G06F 17/10* (2006.01)

(52) U.S. Cl.
CPC .......... *G06F 17/505* (2013.01); *G06F 17/5022* (2013.01); *G06F 17/5068* (2013.01); *G06F 17/10* (2013.01)
USPC ........... 716/105; 716/103; 716/106; 716/131; 703/16

(58) Field of Classification Search
CPC .............. G06F 17/505; G06F 17/5022; G06F 17/5068; G06F 17/10
USPC ..................... 716/105, 103, 106, 131; 703/16
See application file for complete search history.

(56) References Cited

U.S. PATENT DOCUMENTS

| | | | |
|---|---|---|---|
| 5,859,548 A | 1/1999 | Kong | |
| 5,991,789 A | 11/1999 | Prange et al. | |
| 6,002,270 A | 12/1999 | Timoc | |
| 6,046,608 A | 4/2000 | Theogarajan | |
| 6,278,298 B1 | 8/2001 | Hayakawa | |
| 6,338,157 B1 * | 1/2002 | Varshavsky | 716/132 |
| 6,360,352 B2 * | 3/2002 | Wallace | 716/103 |
| 6,381,181 B1 | 4/2002 | Nguyen | |
| 6,392,467 B1 | 5/2002 | Oowaki et al. | |
| 6,420,905 B1 | 7/2002 | Davis et al. | |
| 6,424,181 B1 | 7/2002 | Pogrebnoy | |
| 6,437,604 B1 | 8/2002 | Forbes | |
| 6,473,885 B1 * | 10/2002 | Wallace | 716/107 |
| 6,477,688 B1 * | 11/2002 | Wallace | 716/107 |
| 6,580,296 B1 | 6/2003 | Beiu | |
| 6,609,234 B2 * | 8/2003 | Kurupati | 716/107 |
| 6,838,909 B2 | 1/2005 | Huang et al. | |

(Continued)

OTHER PUBLICATIONS

Beiu V. et al., "VLSI Implementations of Threshold Logic—A Comprehensive Survey," IEEE Transactions on Neural Networks, vol. 14, Issue 5, Sep. 2003, pp. 1217-1243.

(Continued)

*Primary Examiner* — Phallaka Kik
(74) *Attorney, Agent, or Firm* — Withrow & Terranova, P.L.L.C.

(57) ABSTRACT

A method of mapping threshold gate cells into a Boolean network is disclosed. In one embodiment, cuts are enumerated within the Boolean network. Next, a subset of the cuts within the Boolean network that are threshold is identified. To minimize power, cuts in the subset of the cuts are selected.

8 Claims, 16 Drawing Sheets

---

INPUT: A BOOLEAN function $F$ and a cut denoted by set of nodes $S = \{f_1, ..., f_N\}$

OUTPUT: A set of decompositions $D$ of $F$ s.t. $H$-function is a threshold function in DTG library 1  $D = \phi$;
2  If any $f_i \in S$ is not threshold then
3  | return $\phi$;
4  end
5  Find a common weight vector $W_c$ for all functions in $S$ such that $f_1 = [W_c; T_1], ..., f_N = [W_c; T_N]$;
6  If no valid $W_c$ exists then
7  | return $\phi$;
8  end
9  foreach *function* $[W;T]$ *in DTG library s.t.* $W_c \subset W$ do
10  | foreach *minterm $m$ of variables in* $W/W_c$ do
11  | | $f$ = eval $([W;T], m)$;
12  | | If $f \in S$ then
13  | | | Assign code $m$ to *function* $f$;
14  | | end
15  | end
16  | If *all functions in $S$ are assigned a code* then
17  | | $H = [W;T]$;
18  | | $G$ = g-functions (using method in 4.3.1);
19  | | $D = D \cup (H,G)$;
20  | end
21  end
22  return $D$;

(56) References Cited

U.S. PATENT DOCUMENTS

| | | | | |
|---|---|---|---|---|
| 6,938,223 | B2* | 8/2005 | Boppana et al. | 716/105 |
| 7,020,855 | B2* | 3/2006 | Wallace | 716/107 |
| 7,171,633 | B1* | 1/2007 | Hwang et al. | 716/103 |
| 7,398,490 | B2* | 7/2008 | Wallace | 716/103 |
| 7,417,468 | B2 | 8/2008 | Verbauwhede et al. | |
| 7,835,898 | B2 | 11/2010 | Geist et al. | |
| 8,164,359 | B2 | 4/2012 | Leshner et al. | |
| 8,181,133 | B2* | 5/2012 | Gowda et al. | 716/107 |
| 8,601,417 | B2* | 12/2013 | Gowda et al. | 716/107 |
| 2002/0010899 | A1* | 1/2002 | Wallace | 716/2 |
| 2002/0162078 | A1* | 10/2002 | Boppana et al. | 716/1 |
| 2002/0178432 | A1* | 11/2002 | Kim et al. | 716/18 |
| 2002/0184174 | A1 | 12/2002 | Kadri | |
| 2003/0009731 | A1* | 1/2003 | Wallace | 716/5 |
| 2005/0262456 | A1 | 11/2005 | Prasad | |
| 2006/0117280 | A1* | 6/2006 | Wallace | 716/4 |
| 2006/0119406 | A1 | 6/2006 | Henzler et al. | |
| 2009/0235216 | A1* | 9/2009 | Gowda et al. | 716/5 |
| 2009/0300563 | A1 | 12/2009 | Moon | |
| 2011/0214095 | A1* | 9/2011 | Gowda et al. | 716/102 |

OTHER PUBLICATIONS

Gowda T. et al., "Decomposition Based Approach for Synthesis of Multi-Level Threshold Logic Circuits," Design Automation Conference (ASPDAC), Mar. 21, 2008, 6 pages.

Gowda T. et al., "Synthesis of Threshold Logic Circuits Using Tree Matching," 18th European Conference on Circuit Theory and Design (ECCTD), Aug. 27, 2007, 4 pages.

Hopcroft J.E. et al., "Synthesis of Minimal Threshold Logic Networks," IEEE Transactions of Electronic Computers, Aug. 1965, pp. 552-560.

Zhang R. et al., "Synthesis and Optimization of Threshold Logic Networks with Application to Nanotechnologies," Design, Automation and Test in Europe Conference and Exhibition, vol. 2, Feb. 16, 2004, 6 pages.

Luba T., "Multi-Level Logic Synthesis Based on Decomposition," Microprocessors and Microsystems, vol. 18, No. 8, Oct. 1994, pp. 429-437.

Avedillo M. J. et al., "A Threshold Logic Synthesis Tool for RTD Circuits," Proceedings of the EUROMICRO Systems on Digital System Design (DSD'04), 2004, 4 pages.

Avouris P. et al., "Carbon Nanotube Electronics," Proceedings of the IEEE, vol. 91, No. 11, Nov. 2003, pp. 1772-1784.

Blair E.P. et al., "Quantum-Dot Cellular Automata: An Architecture for Molecular Computing", Simulation of Semiconductor Processes and Devices, SISPAD, 2003, pp. 14-18.

Celinski P. et al., "State-of-the-Art in CMOS Threshold-Logic VLSI Gate Implementations and Applications," Proceedings of SPIE, vol. 5117, 2003, pp. 53-64.

Gowda T. et al., "Identification of Threshold Functions and Synthesis of Threshold Networks," IEEE Transactions on Computer-Aided Design of Integrated Circuits and Systems, vol. 30, No. 5, May 2011, pp. 665-677.

Gowda T. et al., "A Non-ILP Based Threshold Logic Synthesis Methodology," Proceedings of the IWLS, 2007, 8 pages.

Gowda T. et al., "Combinational Equivalence Checking for Threshold Circuits," GLSVLSI, Mar. 11-13, 2007, pp. 102-107, Stresa-Lago Maggiore, Italy.

Likharev K.K., "Single-Electron Devices and Their Applications," Proceedings of the IEEE, vol. 87, No. 4, Apr. 1999, pp. 606-632.

Sentovich E. et al., "SIS: A System for Sequential Circuit Synthesis," Memorandum No. UCB/ERL M92/41, Department of Electrical Engineering and Computer Science, May 4, 1992, 45 pages, University of California, Berkeley, CA.

Zhang R. et al., "Threshold Network Synthesis and Optimization and Its Application to Nanotechnologies," IEEE Transactions on Computer-Aided Design of Integrated Circuits and Systems, vol. 24, No. 1, Jan. 2005, pp. 107-118.

Zheng Y., "Novel RTD-Based Threshold Logic Design and Verification," Thesis Submitted to the Faculty of Virginia Polytechnic Institute and State University in Partial Fulfillment of the Requirements for the Degree of Master of Science in Computer Engineering, Apr. 28, 2008, 57 pages, Blacksburg, VA.

Bahar R.I. et al., "A Symbolic Method to Reduce Power Consumption of Circuits Containing False Paths," Proceedings of the 1994 IEEE/ACM International Conference of Computer-Aided Design, 1994, 4 pages.

Chatterjee S. et al., "Factor Cuts," ICCAD, Nov. 5-9, 2006, pp. 143-150, San Jose, CA.

Chuang W. et al., "A Unified Algorithm for Gate Sizing and Clock Skew Optimization to Minimize Sequential Circuit Area," ICCAD Proceedings of the 1993 IEEE/ACM International Conference of Computer-Aided Design, 1993, pp. 220-223.

Coudert O., "Gate Sizing for Constrained Delay/Power/Area Optimization," IEEE Transactions on Very Large Scale Integration (VLSI) Systems, vol. XX, No. Y, Sep. 1997, pp. 1-7.

Eppstein D., "Small Maximal Independent Sets and Faster Exact Graph Coloring," Journal of Graph Algorithms and Applications, vol. 7, No. 2, 2003, 9 pages.

Girard P. et al., "A Gate Resizing Technique for High Reduction in Power Consumption," 1997 International Symposium on Low Power Electronics and Design, Aug. 18-20, 1997, pp. 281-286, Monterey, CA.

Sun J.P. et al., "Resonant Tunneling Diodes: Models and Properties," Proceedings of the IEEE, vol. 86, No. 4, Apr. 1998, pp. 641-661.

Kagaris D. et al., "Maximum Weighted Independent Sets on Transitive Graphs and Applications," Integration, the VLSI Journal, vol. 27, 1999, pp. 77-86.

Leshner S. et al., "Design of a Robust, High Performance Standard Cell Threshold Logic Family for DSM Technology," 22nd International Conference on Microelectronics (ICM 2010), Copyright 2009, 4 pages.

Padure M. et al., "A New Latch-Based Threshold Logic Family," International Semiconductor Conference (CAS 2001), vol. 2, Copyright 2001, pp. 531-534.

Pan P. et al., "A New Retiming-Based Technology Mapping Algorithm for LUT-based FPGAs," Proceedings of the 1998 ACM/SIGDA Sixth International Symposium of Field Programmable Gate Arrays (FPGA '98), Copyright 1998, 8 pages.

Strandberg R. et al., "Single Input Current-Sensing Differential Logic (SCSDL)," IEEE International Symposium on Circuits and Systems (ISCAS 2000), May 28-31, 2000, pp. I-764-I-767, Geneva, Switzerland.

Nukala N. S. et al., "Spintronic Threshold Logic Array—A Compact, Low Leakage, Non-Volatile Gate Array Architecture," 2012 IEEE/ACM International Symposium on Nanoscale Architectures (NANOARCH), Jul. 4-6, 2012, 8 pages.

Augustine C. et al., "Spin-Transfer Torque MRAMs for Low Power Memories: Perspective and Prospective," IEEE Sensors Journal, vol. 12, No. 4, Apr. 2012, pp. 756-766.

Gang Y. et al., "A High-Reliability, Low-Power Magnetic Full Adder," IEEE Transactions on Magnetics, vol. 47, No. 11, Nov. 2011, pp. 4611-4616.

Li J. et al., "Design Paradigm for Robust Spin-Torque Transfer Magnetic RAM (STT MRAM) From Circuit/Architecture Perspective," IEEE Transactions on Very Large Scale Integration (VLSI) Systems, vol. 18, No. 12, Dec. 2010, pp. 1710-1723.

Patil S. et al., "Spintronic Logic Gates for Spintronic Data Using Magnetic Tunnel Junctions," 2010 IEEE International Conference on Computer Design (ICCD), Oct. 3-6, 2010, 7 pages.

Zhang Y. et al., "Compact Modeling of Perpendicular-Anisotropy CoFeB/MgO Magnetic Tunnel Junctions," IEEE Transactions on Electron Devices, vol. 59, No. 3, Mar. 2012, pp. 819-826.

Zhao W. et al., "Spin-MTJ Based Non-Volatile Flip-Flop," Proceedings of the 7th IEEE International Conference on Nanotechnology, Aug. 2-5, 2007, pp. 399-402, Hong Kong.

(56) References Cited

OTHER PUBLICATIONS

Hulgaard H. et al., "Equivalence Checking of Combinational Circuits Using Boolean Expression Diagrams," IEEE Transactions on Computer-Aided Design of Integrated Circuits and Systems, Jul. 1999, 15 pages.

Kulkarni N. et al., "Technology Mapping for Power Using Threshold Logic Cells," GLSVLSI'11, May 2-4, 2011, 6 pages, Lausanne, Switzerland.

International Search Report and Written Opinion for PCT/US2009/061355 mailed Mar. 31, 2010, 12 pages.

* cited by examiner

INPUT: A BOOLEAN function $F$ and a cut denoted by set of nodes $S = \{f_1, ..., f_N\}$

OUTPUT: A set of decompositions $D$ of $F$ s.t. $H$-function is a threshold function in DTG library

1 $D = \phi$;
2 if *any $f_i \in S$ is not threshold* then
3   | return $\phi$;
4 end
5 Find a common weight vector $W_c$ for all functions in $S$ such that $f_1 = [W_c;T_1], ..., f_N = [W_c;T_N]$;
6 if *no valid $W_c$ exists* then
7   | return $\phi$;
8 end
9 foreach *function $[W;T]$ in DTG library s.t. $W_c \subset W$* do
10   | foreach *minterm m of variables in $W/W_c$* do
11   |   | $f$ = eval $([W;T], m)$;
12   |   | if $f \in S$ then
13   |   |   | Assign code $m$ to *function f*;
14   |   | end
15   | end
16   | if *all functions in $S$ are assigned a code* then
17   |   | $H = [W;T]$;
18   |   | $G$ = $g$-functions (using method in 4.3.1);
19   |   | $D = D \bigcup (H,G)$;
20   | end
21 end
22 return D;

*FIG. 4E*

TECHNOLOGY MAPPING FOR THRESHOLD AND LOGIC GATE HYBRID CIRCUITS

STATEMENT OF GOVERNMENT SUPPORT

This invention was made with government funds under contract number CCF-070283 awarded by the National Science Foundation. The U.S. Government has rights in this invention.

RELATED APPLICATIONS

This application claims the benefit of provisional patent application Ser. No. 61/651,659, filed May 25, 2012, the disclosure of which is hereby incorporated herein by reference in its entirety.

FIELD OF THE DISCLOSURE

This application relates generally to systems and methods of mapping threshold and logic gate cells in order to design circuit architectures.

BACKGROUND

A Boolean function $f(x_1, x_2, \ldots, x_n)$ is called a threshold function if there exist weights $w_1, w_2, \ldots, w_n$ and a fixed threshold T such that $$f(x_1, x_2, \ldots, x_n) = \left\{ \text{if } \sum_{i=1}^{n} w_i x_i \geq T \right. \tag{1}$$

Without loss of generality, we may assume that $w_i$ and T are integers. A threshold function $f(x_1, x_2, \ldots, x_n)$ will be represented by $[w_1, w_2, \ldots, w_n; T]$. The following are the two examples of threshold function.

$$f(a, b, c) = a \vee bc \tag{2}$$

$$= [w_a = 2, w_b = 1, w_c = 1; T = 2] \tag{3}$$

$$= [2, 1, 1; 2] \tag{4}$$

$$g(a, b, c, d, e) = ac(b \vee d \vee e) \vee de(a \vee bc) \vee ab(d \vee e) \tag{5}$$

$$= [w_a = 2, w_b = 1, w_c = 1, w_d = 1, w_e = 1; T = 4].$$

$$= [2, 1, 1, 1, 1; 4] \tag{6}$$

A CMOS gate (or cell) refers to a combinational or sequential switching circuit that computes a certain Boolean function, constructed using Complementary Metal Oxide Semiconductor architecture The CMOS network (or circuit or net-list) refers to a network of CMOS gates.

A threshold gate is a single primitive or a non-decomposable circuit that realizes a threshold function and one that physically embodies the comparison expressed in Equation (1). Therefore this excludes implementations that realize the threshold functions as simply Boolean functions using a network of Boolean primitives created using CMOS architecture.

The TLL or threshold logic latch cells refer to the circuits with a differential sense amplifier based architecture specifically designed to compute a threshold function. A TLL cell is essentially one possible implementation of the threshold gates.

A hybrid network is a network consisting of both CMOS and TLL cells.

Hybridization is defined as the process of converting a CMOS circuit into a Hybrid circuit in such a way that the functional and the timing behavior of the Hybrid circuit are same as that of the original CMOS circuit, while improving certain other characteristics such as power, area and delay.

As is evident from the example of the function g(a, b, c, d, e) above, a single threshold gate can implement a complex logic function, which in conventional logic design might require a multilevel network of several logic gates.

Since not all Boolean functions are threshold, an essential computation in the threshold logic synthesis is to determine whether or not a given Boolean function is a threshold function. Until recently this was done by solving an integer linear program (ILP) based on Equation (1). This approach is practical only for functions with small support sets and cannot be used when exploring a large gate level netlist for threshold functions. A new, fast approach for identifying a threshold function based on binary decision diagrams (BDD) may be used. Its efficiency allows it to be used repeatedly and to explore a given netlist much faster than the ILP based methods.

A substantial body of literature also exists on the circuit architectures for threshold gates. Among the various types, those based on differential logic such as DCSTL and SCSDL have been the most promising because they employ the conventional CMOS devices, require no special processing and have been shown to be very fast and low power. Unfortunately, the existing differential logic architectures are highly susceptible to failure due to noise and sizing them to achieve the same level of noise margin as TLL makes their power and delay unacceptably high.

A TLL cell in the library is a clocked sequential element that employs differential logic to compute a threshold function $f(x_1, x_2 \ldots x_n)$ (both n and f vary from cell to cell) on a clock edge. Thus a library cell is referred to as a threshold logic latch (TLL) as it can be viewed as the integration of an edge triggered flip-flop and a threshold function. Although a TLL cell employs differential logic to implement a threshold function, it achieves the level of robustness with respect to noise and process variations that is required for high performance designs, and is superior to existing threshold logic architectures in terms of area, power and delay. Note that a TLL represents one embodiment of a general class of Differential mode Threshold Gates (DTGs). Since the present disclosure applies to any of such DTGs, we will use the term DTG to mean any embodiment of Differential mode Threshold Gates, such as TLLs.

SUMMARY

The present disclosure relates to the design of a standard cell library of threshold gates called Differential mode Threshold Gates cell (DTG) using a differential mode architecture and a functional decomposition method to map arbitrary Boolean functions using DTGs. The technology mapped netlist consists of both conventional CMOS logic cells and DTGs and is referred to as a hybrid circuit. The proposed decomposition technique produces hybrid circuits that have up to 36% less dynamic power, about 50% less leakage power and around 38% less area, post place and routing using a commercial 65 nm LP (low power) library, operated at the same (peak) frequency as the optimized conventional CMOS implementation.

Described herein is a way to design a standard cell library for Differential mode Threshold Gates called DTGs. The intent of this library is to augment existing standard CMOS cell libraries so as to improve the area and power of the resultant hybrid circuits. However, these standard cells are slightly different from existing CMOS based standard cells in certain ways. Due to these differences it is not possible for state of the art design synthesis tools to embed them into sequential circuits as is. Therefore a novel method to incorporate these cells into the circuits is described. This novel method involves representing arbitrary Boolean functions using functions implementable by DTGs, using Boolean function decomposition.

The final netlists consisting of DTGs and existing CMOS standard cells exhibit substantial reduction in dynamic and leakage power measured at the same performance. The post place and route area of the circuits is also improved.

The resultant hybrid netlists have significantly lower dynamic and leakage power with considerable area reduction. Note that the performance of hybrid netlist is same as their CMOS counterparts.

The design of a standard cell library of threshold logic (TLL) cells and a new method and methodology for mapping the subnetworks in a sequential circuit onto the appropriate cells in the library is further described. The technology mapped netlist consists of both conventional CMOS logic cells and TLLs and is referred to as a hybrid circuit. The mapping procedure targeting power reduction produces hybrid circuits that have significantly lower power and area operated at the same frequency as the optimized conventional CMOS implementation. The mapping procedure targeting power reduction produces hybrid circuits that have up to 33% less power and up to 18% less area, operated at the same frequency as the optimized conventional CMOS implementation.

The present disclosure further relates to a circuit architecture for a Differential mode Threshold Gate, referred to as a threshold logic latch (TLL), for computing a threshold function, the design of a standard cell library of TLL cells and variety of methods for incorporating them in a CMOS network. The resultant network consists of both CMOS gates and TLLs and is referred to as a hybrid circuit. These hybridization methods may substantially reduce area and power of the hybrid circuit operated at the same frequency as the optimized conventional CMOS implementation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4E illustrates one embodiment of a threshold decomposition algorithm.

DETAILED DESCRIPTION

Figure 1:
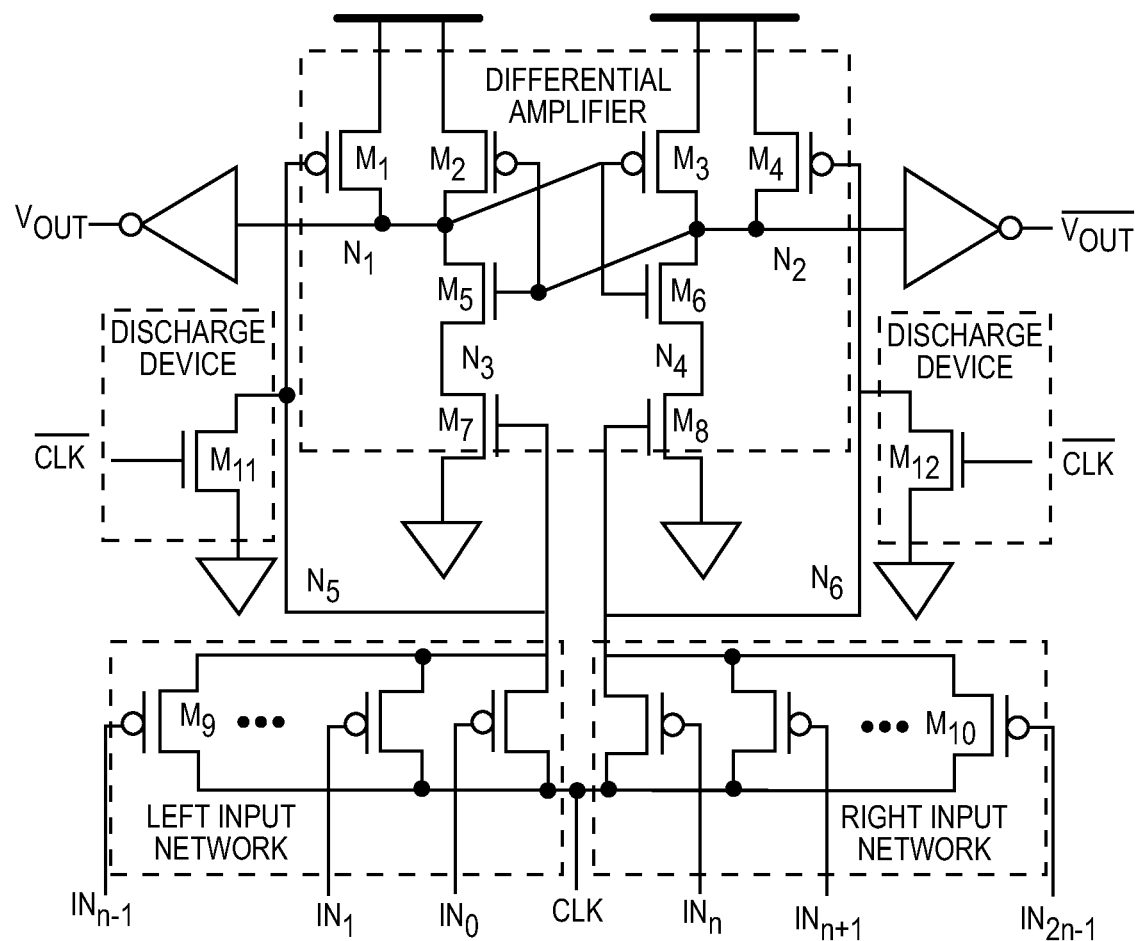
FIG. 1 illustrates a visual representation of one embodiment of a Differential mode Threshold Gate cell (DTG) called a threshold logic latch (TLL).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to the field of automated design of sequential CMOS circuit using standard cell based (ASIC design). The cell library consisting of the DTG cells is compatible with state of the art automation tools. The DTG cells are different from existing standard CMOS based cells in three ways. (1) They implement complex threshold functions which cannot be identified/decomposed by existing tools, (2) their sum of products form (SOP) is unacceptably large, (3) they are programmable in the sense the function implemented by them depends on how their inputs are wired. Due to these reasons, existing commercial tools cannot make use of the DTG cells as is. This gave rise to the proposed idea of decomposition of Boolean functions which maps certain sub-circuits in sequential circuits using DTG cells. The following concepts are described in further detail below:
1. Use of Threshold logic as opposed conventional Boolean logic
2. A function decomposition technique to represent arbitrary Boolean functions as Threshold functions
3. Creation of hybrid netlists i.e. the netlists consisting of both DTG and CMOS cells The present disclosure describes the design of a standard cell library of threshold gates built using architecture called Differential mode threshold gates (DTGs) and a functional decomposition method to map arbitrary Boolean functions using DTGs. The technology mapped netlist consists of both conventional CMOS logic cells and DTGs and is referred to as a hybrid circuit. The proposed decomposition technique produces hybrid circuits that have up to 36% less dynamic power, about 50% less leakage power and around 38% less area, post place and routing using a commercial 65 nm LP (low power) library, operated at the same (peak) frequency as the optimized conventional CMOS implementation.

Described below is the design of a standard cell library using differential mode threshold gates and a method of technology mapping through threshold decomposition which can result in significant improvement in area and power of the circuit at the same performance. We used an existing DTG cell architecture and optimized it for delay and reliability. A standard cell library, compatible with commercial VLSI design tools was generated using a set of DTG cells.

Each cell in the library is a clocked sequential element that employs differential logic to compute a threshold function $f(x_1, x_2, \ldots, x_n)$ (both n and f vary from cell to cell) on a clock edge. Thus a library cell is referred to as a differential mode threshold gate (DTG) as it can be viewed as an integration of a edge triggered flipflop and a threshold function. Although a DTG cell employs differential logic to implement a threshold function, it achieves the level of robustness with respect to noise and process variations that is required for high performance designs, and is superior to existing threshold logic architectures in terms of area, power and delay.

Apart from the library generation, also described herein is a novel method to automatically incorporate the DTG cells in the sequential logic networks. The result is referred to as a hybrid netlist as it has both conventional logic cells and DTG cells. The hybridization is aimed at reducing the total area of the circuit. The reduction in area also reduces dynamic and leakage power. The proposed hybridization method yields a maximum power improvement of 38% with the simultaneous dynamic power reduction up to 36% and leakage improvements as large as 50% on large modules such as 32 bit MAC, multipliers and FIR filters.

The structure and the operation of a DTG are now described. A DTG cell (see FIG. 1) has three main components. (1) A differential amplifier (2 cross coupled NAND gates). (2) two discharge devices and (3) left and right input networks. The relevant output nodes are $N_1$ and $N_2$. The actual circuit has these two nodes as inputs to an SR latch (not shown) and an internal buffering of the clock (not shown).

The circuit is operated in two phases: reset (clk=0) and evaluation (clk 0→1). When clk=0, the two discharge devices pull nodes $N_5$ and $N_6$ low, which results in $N_1$ and $N_2$ being pulled high. All the paths to the ground (through $M_7$ and $M_8$) are disconnected. Note that the transistors $M_5$ and $M_6$ are ON.

Now assume that input signals are applied to the left and the right input networks such that the number of devices that are active in the left and the right input networks are not equal. A signal assignment procedure will ensure that this will always be the case. Without loss of generality assume that the left network has more ON devices than the right network. Therefore the conductance of the left network is higher than that of the right network.

When the clock switches from 0 to 1, the discharge devices $M_{11}$ and $M_{12}$ get turned off. First, node $N_5$ starts to rise and $M_7$ gets turned on. This starts to turn off $M_1$, discharging $N_1$ through $M_5$ and $M_7$. The delay in the start time for charging node N6 due to the lower conductance of the right input network allows $N_1$ to turn on $M_3$. Thus, even if $N_2$ starts to discharge initially, its further discharge is quickly impeded as $M_3$ turns on, and is quickly pulled back to 1. Therefore output node $V_{out}$ is 1 and $\overline{V_{out}}$ is 0. Note that by simple, proper sizing of the pull-down devices in the differential amplifier, the cell can be made to achieve a very good noise margin. The input transistors are best kept at the minimum size to reduce the power consumption.

The working of the DTG is exactly the same as an edge triggered flipflop with embedded logic. However note that setup time of this architecture is near zero (even negative) where Clock-to-output delay is almost same as that of the D-flipflop. Therefore the delay of the logic absorbed by DTG disappears completely which is not the case with certain flipflops which embedded logic. In fact, delay of DTGs is almost independent of the function implemented by them. Additionally, the input capacitances of DTGs are significantly lower than D-flip-flop which results in faster slews and increased slacks in the circuit.

Consider the threshold function $f(a,b,c)=a \vee bc$. It can be expressed as $f(a,b,c) \equiv (2a+b+c \geq 2)$. In a DTG, a unit weight represents a unit conductance, which corresponds to a single transistor in the input networks. To ensure the proper functioning of a DTG, no input assignment should result in having the same number of devices ON in the left and the right networks. Since both the sides of the inequality are integers, it can be replaced with a strict inequality by subtracting 0.5 from the threshold. Thus f(a,b,c) can also be expressed as $$f(a,b,c) \equiv 2a+b+c > 1.5 \qquad (7)$$

In (7) the unit conductance is now represented by 0.5. Therefore each transistor represents a conductance of 0.5. Consequently, (7) when expressed in units of transistors becomes $$f(a,b,c) \equiv 4a+2b+2c > 3 \qquad (8)$$

Any inequality equivalent to (8) can be realized by assigning the appropriate signals to the inputs networks of a DTG cell. The choice of the inequality determines the number of inputs of the DTG cell and consequently the area, power, delay and noise margin. Consider (8) itself. It can be realized by the following signal assignment $$\underbrace{a, a, a, a, \overline{b}, \overline{b}, \overline{c}, \overline{c}}_{\text{Left Input Network}} \mid \underbrace{0, 0, 0, 1, 1, 1, 1, 1}_{\text{Right Input Network}} \qquad (9)$$

The above modification results in the threshold always being odd, and the sum of the weights on the left input network always being even. Note that the devices in each network are PMOS. The signal assignment (9) leads to a highly sub-optimal cell. It has 8 inputs on each side and 3 devices in the right network that are always ON. Now consider the following algebraically equivalent representation of (8).

$$f(a,b,c) \equiv 2a+b+2c > 2(1-a)+(1-b) \qquad (10)$$

Since $(1-a) = \overline{a}$, (10) corresponds to the signal assignment shown below.

$\bar{a},\bar{a},\bar{b},\bar{c},\bar{c}|a,a,b,1,1$ (11)

Assignment (11) requires a DTG cell with only 5 inputs on each side (DTG-5) and no devices that are always active. Assignments (9) and (11) also differ in the fanin and the complexity of physical wiring around the cell.

Given a threshold function, it is possible to determine a signal assignment that eliminates the permanently ON devices, maximizes the worst case noise margin and minimizes the worst case delay and power. This assignment is referred to as the optimal signal assignment (OSA). Conversely, given a DTG cell with k devices in each of the input networks, and restricting the signal assignment to be OSA, it is possible to enumerate the set of all threshold functions that can be mapped to that gate. For example, DTG-3 can implement three functions: a∨b, ab, ab∨bc∨ac, DTG-5 can implement eight threshold functions: [1,1,1;1], [1,1,1;3], [1,1,1,1; 2], [1,1,1,1;3], [1,1,1,1,1;3], [2,1,1;2], [2,1,1;3], [2,1,1,1;4].

A generic DTG library consists of 7 basic cells depending on Fanin: DTG-1, 3, 5, 7, 9, 11 and 13. For each cell, the set of threshold functions that can be realized by that cell under OSA, are enumerated. This set contains 338 functions. However these functions can be classified based on their reliability worst case (explained below). The optimization required for all the function sharing a reliability worst case is same. There are 17 total reliability cases of 7 cells there are only 17 different layouts corresponding to the entire library. Note that the function of cell is determined based on how it is wired in the netlist and this wiring is decided during hybridization (explained in further detail below). For each cell there are 5 different drive strengths hence the entire DTG library consists of 85 layouts.

Each of the cells has been optimized to minimize the worst case delay by appropriate sizing of the differential amplifier and the SR latch. The driving strength of the DTG can be adjusted by sizing the output inverter. The transistors in both the input networks are kept at the minimum size in order to minimize the input capacitance and the power consumed in both the input networks. It should be noted the library of DTG cells cannot be mapped by the existing commercial synthesis tools (such as Cadence RTL compiler) as is, due to the fact that input signals of the function must be properly assigned to the inputs of DTGs (OSA) to realize a threshold function. Moreover, it is not possible to describe each function in the sum of products (SOP) form required in the standard libraries, since the SOP expressions of most threshold functions in the DTG library are unacceptably large. Another reason is that a DTG without signal assignment essentially has several input combinations that are race conditions which are not supported by most of the synthesis tools. It is for these reasons that we have devised an external mapping procedure for DTGs. The term hybridization and mapping are used interchangeably to denote that hybridization focuses on using the functions in DTG library which is akin to technology mapping.

The DTG cells contain the sense-amplifier which is not a digital (CMOS-like) component per-se. Therefore it is important to ascertain that DTG cells work at prescribed voltages with given reliability. The reliability of cell (defined as the number of failures in N monte carlo HSPICE simulations for a sufficiently large N) mainly depends on the input combination or case. For example if 3 devices are ON on the input side and 2 devices are ON on the threshold side, the input case is said to be 3/2 (or 2/3 due to the symmetricity of the cell). It can be shown that for the DTG-K, the reliability worst case is $$\frac{K+1}{2} \Big/ \frac{K-1}{2}$$

and reliability gets worse as K increases. The worst case process corner for DTG depends on the technology, for example, in 65 nm the worst case process corner can be Fast-Slow at low temperatures however for 130 nm it may be Slow-Slow at higher temperatures.

Figure 2:
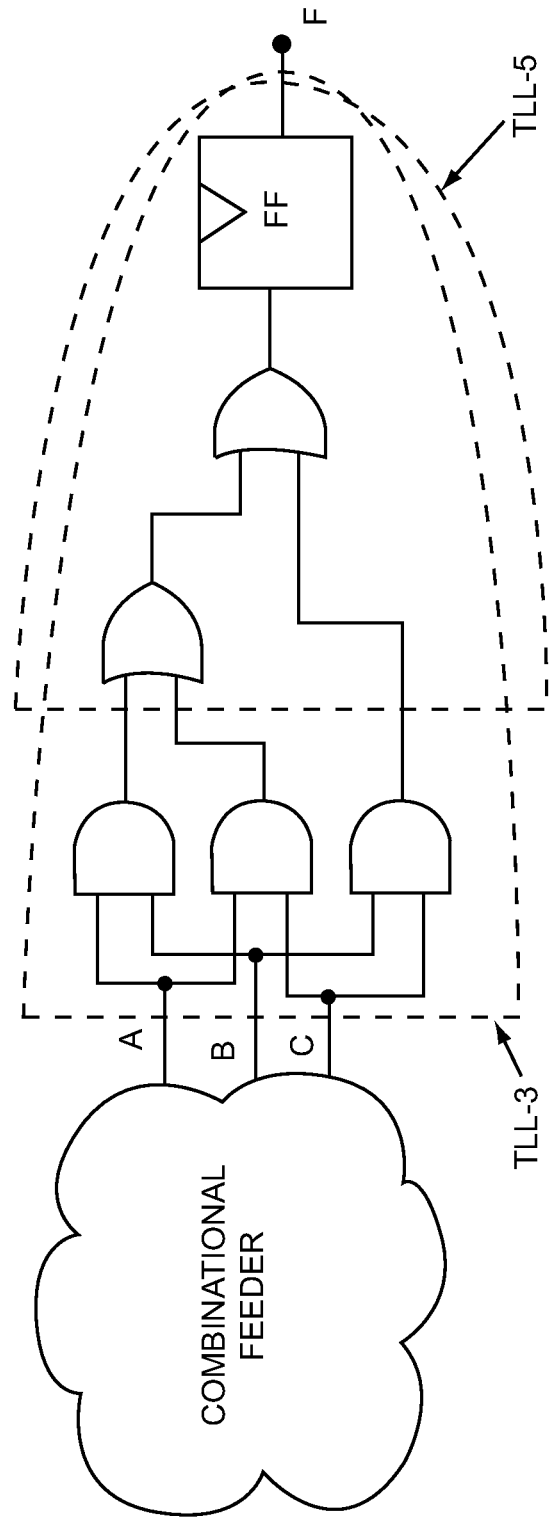
FIG. 2 is a visual representation of different embodiments of cuts that are replaceable by the DTG shown in FIG. 1.

Recall that a DTG cell is a multi-input edge triggered flipflop computing a threshold function. The hybridization or mapping procedure therefore involves replacing subcircuits/cuts in logic cone ending at a flipflop (sometimes referred to as feeder cone of flipflop) with a functionally equivalent form consisting of a DTG and some logic (if necessary). The equivalent form of a function consisting of a DTG is obtained using a Threshold Decomposition technique described further below. Also since DTGs are sequential, the subcircuits that DTGs can replace must contain flipflop. FIG. 2 depicts the idea of hybridization.

The hybridization process consists of considering a flipflop and feeder logic cone, enumerating cuts in this logic cone, decomposing the function of each cut and finally choosing one decomposition of one cut amongst all. The decomposition that leads to smallest area/power of the feeder cone is chosen and inserted into the netlist. The process is repeated for all flipflops, storing intermediate netlists as DTGs are added to the circuit. At the end, the minimum area netlist is chosen as final hybrid candidate. The entire procedure of hybridization focuses on minimizing number of gates and reducing size of remaining gates using the slacks. The reduction in area results in reduction in dynamic as well as leakage power. Each step of hybridization is described below in greater detail.

A procedure for fast cut enumeration is now described. In hybridization, the cuts are enumerated for each logic cone terminating at a flipflop. The combinational circuit in a cone is typically represented as a directed acyclic graph (DAG) where the nodes are gates and directed edges are the interconnects. A source (sink) vertex is one that has no incoming (outgoing) directed arcs. A cut in a DAG G=(N, A) is a minimal set of edges C such that every directed path from any of the source vertices to any of the sink vertices contains at least one member of C.

Figure 3A:
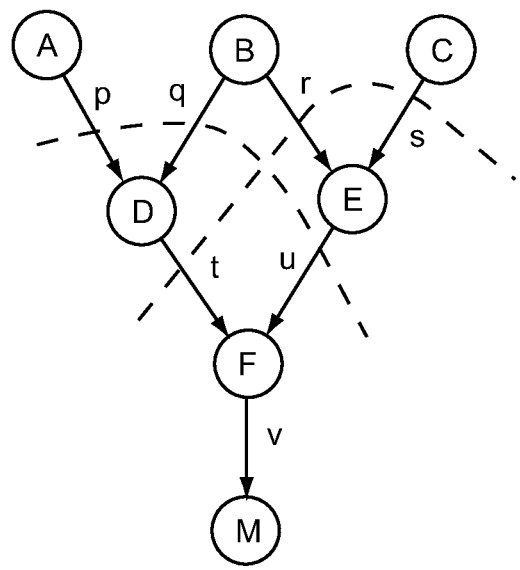
FIGS. 3A and 3B illustrate a visual representation of one embodiment of a directed acyclic graph (DAG) and corresponding maximal independent sets in a line dependency graph (LDG).
Figure 3B:
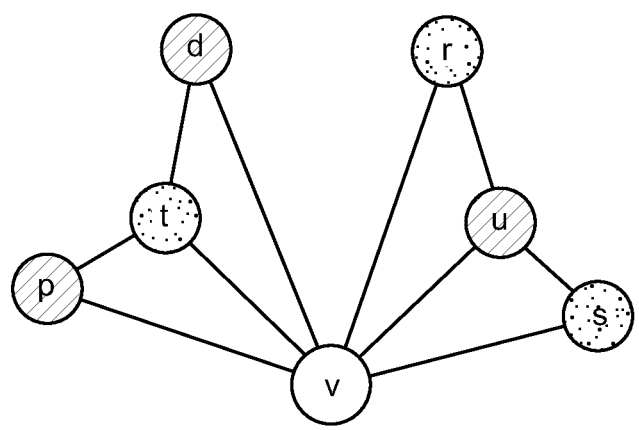

A summary of a cut enumeration procedure is now described. Given a DAG G=(N, A), a line dependency graph (LDG) is an undirected graph L=(V, E) where V=A i.e. each edge in the DAG is a vertex in the LDG and two vertices in LDG are adjacent if and only if the corresponding edges in DAG lie on the same directed path. It has been proved that a maximum independent set in an LDG is the same as a maximum cut in the DAG. This idea can be extended by observing that any maximal independent set in LDG is a cut in the DAG. FIGS. 3A and 3B show the relation between cuts and maximal independent sets.

Thus, enumerating cuts of size k in a DAG is the same as enumerating maximal independent sets (MIS) of size k in the corresponding LDG. There exists a large body of literature on enumerating the maximal independent sets no larger than k. The method of cut enumeration used in the hybridization procedure is based on a heuristic. The novelty of the proposed method involves speeding up this heuristic by transforming the LDG by adding and removing certain vertices and edges without eliminating any k sized maximal independent sets.

A vertex u in an LDG can be removed if and only if the smallest MIS containing u is larger than k. Since an MIS is the same as a cut in the DAG, the smallest MIS corresponds to the minimum cut. Using network flow, the size of the minimum cut containing edge u can be determined. Similarly an edge (u, v) can be added to the LDG if and only if the smallest MIS containing both u and v is larger than k. The complexity of cut enumeration can be shown to be lower for the modified LDG. Since neither vertex removal nor edge addition eliminates a k sized MIS, it follows that all the k sized MISs of the original LDG are same as the k sized MISs in the modified LDG. Hence, no cuts are lost.

This concept is illustrated by the DAG shown in FIG. 3A. Suppose that the cuts of size at most 2 are sought. In that case, the vertices p, q, r, s can be removed (from corresponding LDG in FIG. 3B, since the smallest MIS containing any one of them is larger than 2. The remaining LDG, consisting of the vertices {t, u, v}, contains two MISs i.e. {u, t}, {v} which corresponds to cuts in the DAG. If the cuts of size 3 or less are required then we can add edges (p, r), (q, r),(p, s),(q, s) so that resultant LDG does not have an MIS of size 4 i.e. {p, q, r, s}. It should be noted the speedup obtained by the proposed method specifically described herein has an order of magnitude.

A threshold decomposition method that enables representation of an arbitrary Boolean function using a threshold function in a DTG library is now described. The decomposition method is an extension of an existing BDD based disjoint decomposition method.

First, the idea is described for better understanding of the proposed threshold decomposition technique.

DEFINITION 1. A Boolean function $F(x_0, x_1, \ldots, x_{n-1})$ is said to be decomposable under a bound set of variables $\{x_0, x_1, \ldots, x_{i-1}\}$ and a free set of variables $\{x_i, \ldots, x_{n-1}\}$ for $0<i<n$, if there exists a function H such that $F=H(g_0(x_0, \ldots, x_{i-1}), \ldots, g_{k-1}(x_0, \ldots, x_{i-1}), x_i, \ldots, x_{n-1})$ for $0<k\leq i$.

Function H is referred to as H-function and functions $g_i$ are referred to as g-functions. g-functions, along with variables in the bound set, are inputs to the function H (referred to as g-variables). The bound sets and the free sets are arbitrary choices and each different choice yields a different decomposition. Since the free set and the bound set are disjoint, this is called disjoint decomposition.

Figure 4A:
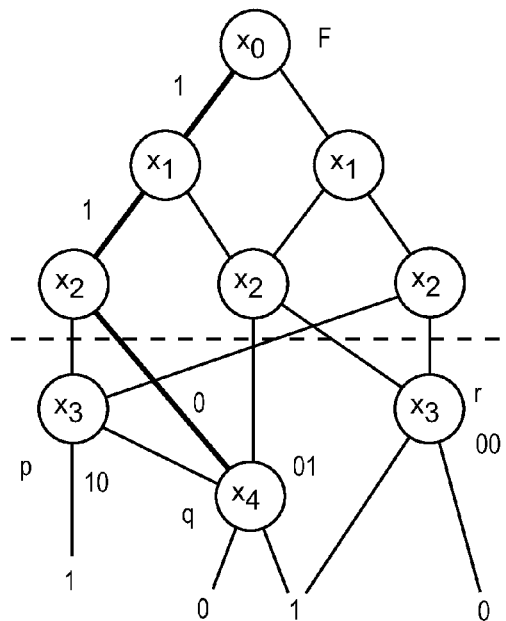
FIGS. 4A-4D are a visual illustration of one embodiment of a function F to be decomposed, embodiments of g-functions, and embodiments of H-functions.

Suppose we are given a Boolean function F as in FIG. 4A, and a bound set $B=\{x_0, x_1, x_2\}$. A bound set in the BDD corresponds to a horizontal cut in the BDD. For example, as shown in FIG. 4A, the cut for the bound set B is set of nodes $S=\{p, q, r\}$. Note that a cut in the BDD is not related to the cuts in a logic cone mentioned earlier.

Step 1: For each of the nodes in the cut, a unique code is assigned. For N nodes, each code can be represented as a bit sequence of length $k=\log_2 N$. The assignment of code is strictly arbitrary and different assignments yield different decompositions. In fact we shall shortly see that the problem of threshold decomposition is the same as finding an assignment for which the resultant H function is a function in the DTG library, if such an assignment exists. In the example, node p is assigned code 10, node q=01 and node r=00.

Figure 4B:
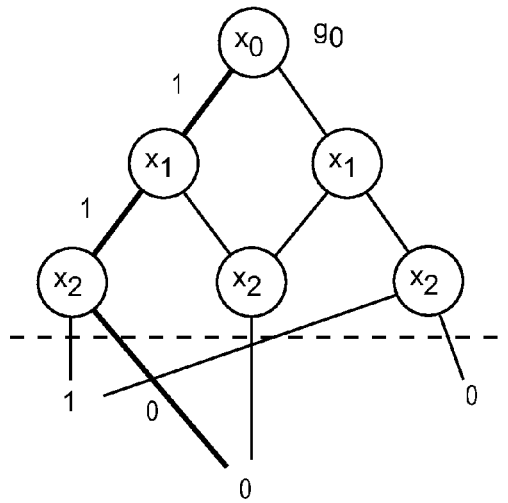
Figure 4C:
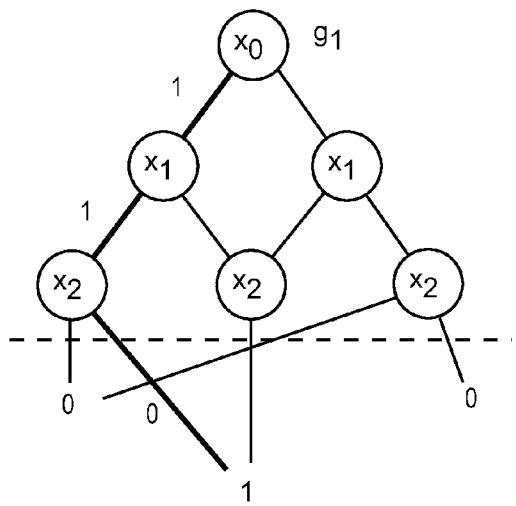

Step 2: After encoding of nodes, we construct g-functions. There are always exactly as many g-functions as the length of the code (k) viz. $g_0, \ldots, g_{k-1}$. BDD of function $g_i$ is computed using BDD of F using a simple method. Start with BDD of F. Then, for each node f in the cut with encoding $(b_0, \ldots b_{k-1})$, replace the node f with a constant, $b_i$. In the given example, the length of code is 2. Therefore two functions $g_0$ and $g_1$ are computed. FIG. 4B shows the computation of $g_0$ where each node in the cut (p, q, r) is replaced with first bit of its code. FIG. 4C shows computation of $g_1$ where each node in the cut is replaced with second bit of its code.

Figure 4D:
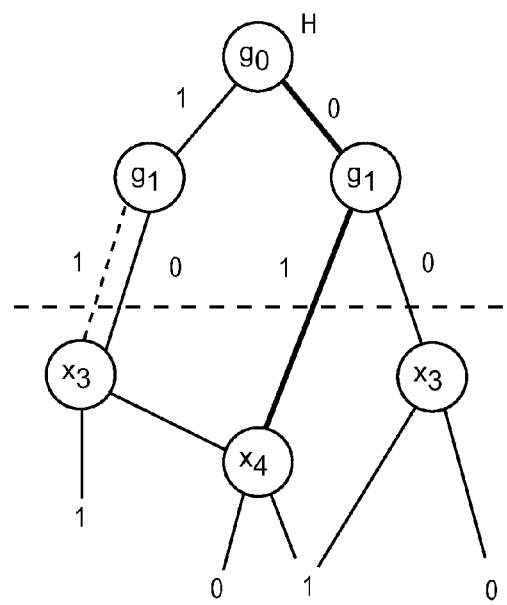

Step 3: The final step is to define H-function. Equations (12) and (13) below show construction of H.

$$T_i = [(b_0^i \oplus g_0) \vee \ldots \vee (b_k^i \oplus g_k)] \wedge f_i, 1 \leq i \leq N \quad (12)$$

$$H = T_1 \vee T_2 \vee \ldots \vee T_N \quad (13)$$

where $f_i \in S$ and $(b_0^i, b_1^i, \ldots, b_k^i)$ is its encoding. FIG. 4D shows the BDD for function H. By definition of H, the code of each node in the cut is exactly same as the input combination of g-variables traced from the root in BDD of H. For example, the node p is encoded as 10 in original function F. This node is computed from H by setting $g_0, g_1 = 1, 0$. Therefore every minterm of g-variables corresponds to the encoding of a node in the original cut. Note that some minterms of g-variables correspond to unassigned code such as 11. These can be arbitrarily assigned to any nodes in the cut. For example, the unassigned code 11 is assigned to node p which results in reduction of BDD of H.

The construction of H and g functions completes the decomposition of F.

The rationale behind working of this procedure follows. For a given assignment A of bound variables, original function F evaluates to certain node in the cut, say f. If f is assigned certain minterm $(g_0, \ldots, g_{k-1})$ of g-variables (code), then we make sure that for the same assignment A of bound variables, the g-functions evaluate to exactly that minterm (code). For example, given an assignment $(x_0, x_1, x_2) = (1, 1, 0)$ of bound variables, function F evaluates to node q. Since node q is reachable by g-variable assignment $(g_0, g_1) = (0, 1)$, we ensure that $g_0$ evaluates to 0 on $(x_0, x_1, x_2) = (1, 1, 0)$ and $g_1$ evaluates to 1 on the same.

The technique described herein is an extension of the BDD based decomposition procedure where H-function is sought to be threshold. An arbitrary encoding of nodes in the cut determines the H-function. It is then possible to determine whether it is a threshold function. Hence the generic problem can be stated simply as follows.

Given a set of nodes in the cut of an arbitrary BDD, determine an encoding of these nodes for which the resultant H-function is threshold. The generic problem stated above can be proved to be NP-Hard. Any generic algorithm to solve it therefore has exponential time complexity. In the following description, the words Boolean function and BDD node are used interchangeably.

The necessary conditions for H to be threshold are as follows and these follow easily from basic axioms of threshold logic.

1. Every node in the cut must be a threshold function. This follows directly from the fact that every Shannon Cofactor of a threshold function is also a threshold function.
2. There exists a common weight vector W for every function (node) in the cut. Therefore every node Ni in the cut is a threshold function of the form $N_i = [W; T_i]$.

There are a couple of approaches to design exact algorithms for this problem.

Based on the number of nodes in the BDD of F and in the cut, It is possible to put an upper bound on the maximum weight of resultant threshold function. Using the maximum weight information, it is possible to derive a circuit-SAT based formulation. The single output circuit produced by formulation is satisfied if and only if a threshold function exists. However, solving the circuit-SAT was found to be impractical even for small instances of input BDD.

Alternatively, it is also possible to determine the required encoding by searching of the encoding space. The solution space can be narrowed down significantly by prohibiting certain encodings.

Note that a decomposition algorithm is run on every horizontal cut (n of them) in the BDD of every cut (subcircuit) in the cone for each flipflop. Both exact algorithms were found to be too slow to be practical.

The exact algorithms are slow and the solution generated by them may not be in DTG library. Therefore described below is a fast heuristic targeted specifically to the DTG library. The algorithm (algorithm 1 shown in FIG. 4E) is given below.

Algorithm 1 starts by checking two necessary conditions (lines 1-7) described above. At the end of step 8, a threshold function in DTG library which contains the common weight vector $W_c$ for all functions in the cut is obtained. If one not found, failure is returned. The variables corresponding to weights in $W/W_c$ are precisely the g-variables. The size of support set of H is known beforehand; hence we look at only those functions in DTG library having the desired size of support set. Since nodes in S must be cofactors of H with regard to g-variables, we run a check (lines 9-14) to ensure that cofactors with regard to all minterms of g-variables must belong to S and only S. The minterm associated with $f_i \in S$ is its encoding. Given an encoding, g-functions can be computed using the BDD of F as described above.

The condition in step 2 is implemented using isThreshold algorithm. This algorithm is not exact for all threshold functions however experimentally we determined that it is exact for all the functions in DTG library. The computation of common weight vector ($W_c$) is also an equally hard a problem as identifying threshold function itself. For exactness, it can be solved using Integer Linear Programming (ILP). Since ILP runtimes are not practical, the implementation employs a heuristic to speed it up. The heuristic finds a common weight vector between every pair of nodes in S and checks if resultant common weight vector works for all nodes in S. The procedure to find a common weight vector between a pair of nodes called tryEqualizeWeights.

A particular cut in the BDD of F where S={F} i.e. the cut at the top of the BDD is a special cut in which function F must be threshold for the valid decomposition to exist. In this case, the g-functions do not exist as bound set is empty. Such cuts are most preferable since any logic due to g-functions is eliminated. Extending the idea further, we observe that it is preferable to have bound set as small as possible to minimize the g-functions. Therefore the cuts in the BDD are examined from top to bottom until decomposition is found.

Figure 5A:
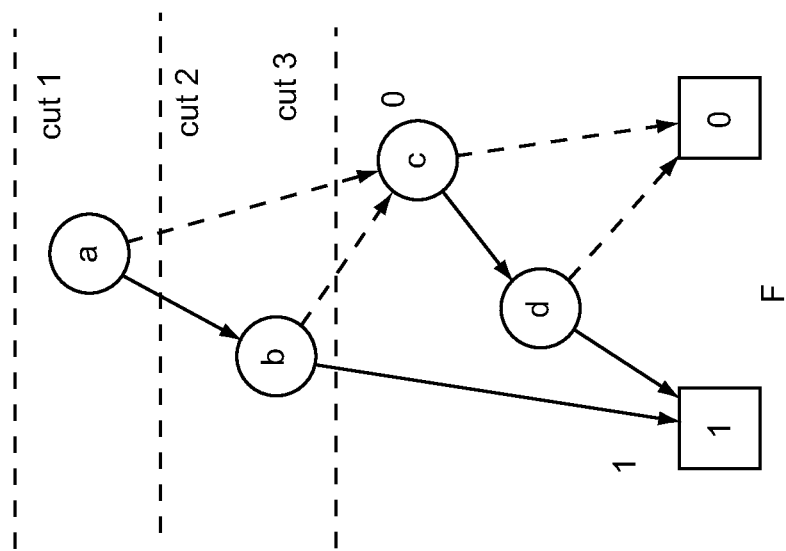
FIGS. 5A-5C illustrate one example of threshold decomposition of a non-threshold input function F and a cut computing a g-function, and an H-function.
Figure 5B:
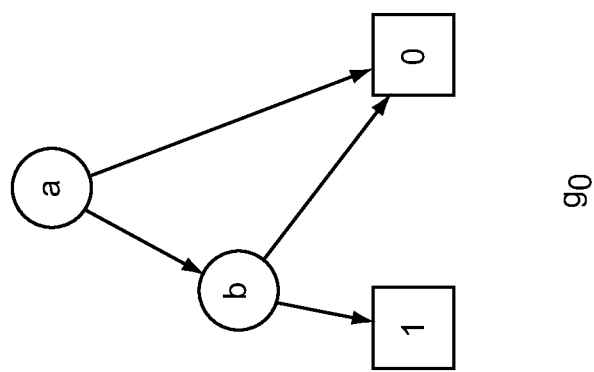
Figure 5C:
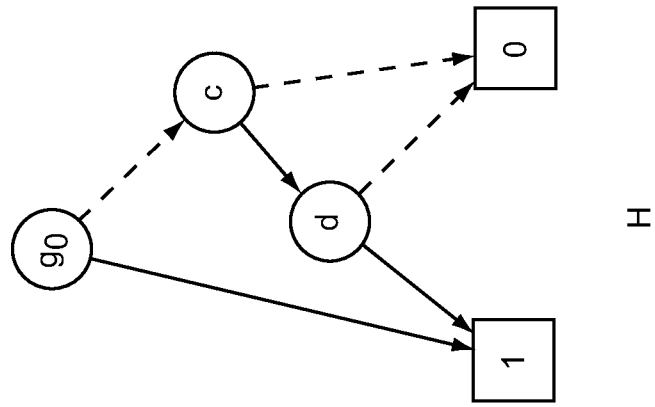

An example of the decomposition is shown in FIGS. 5A-5C. FIG. 5A shows an input non-threshold function ab+cd. Cut 1 is not valid since top node is not a threshold function. Cut 2 is not valid since the nodes below it do not satisfy the total ordering. Cut 3 is valid since all necessary conditions are satisfied. The common weight vectors of nodes c and 1 are respectively [$w_c=1$, $w_d=1$; T=2] and [$w_c=1$, $w_d=1$; T=0]. The common weight vector [1, 1] is then searched in the DTG library for a match. A candidate match containing common weight vector is [2, 1, 1; 2]. Cofactors of [2, 1, 1; 2] with regard to $g_0$ having weight 2, are [$w_c=1$, $w_d=1$; T=0] and [$w_c=1$, $w_d=1$; T=2], therefore this function yields valid decomposition. FIGS. 5B and 5C show the construction of $g_0$ and H respectively. Thus the resultant decomposition is F=$g_0$+cd and $g_0$=ab.

The set of functions in the DTG library are described as a list of positive weights and threshold pairs. The set of positive threshold functions are an extremely small subset of total NP equivalent functions that the DTG library can actually implement. Given two threshold functions f and g, it is computationally easy (polynomial in terms of n) to determine if they belong to the same NP class or not. The technique involves converting both the weight vectors to a positive weight vector (which removes ambiguity of negations). The weight vectors are then sorted in the nonincreasing order of weights (which removes ambiguity of permutations). If the positive, sorted (by weight) form of f and g are identical, then the functions f and g belong to the same NP equivalence class.

For example, both the functions $f=\overline{ab}+c=[w_a=-1, w_b=-1, w_c=2; T=0]$ and $g=b+a\overline{c}=[w_a+1, w_b=2, w_c=-1; T=1]$ are NP equivalent since the positive, sorted forms of f and g are the same i.e. [2, 1, 1; 2].

The condition at line 9 in algorithm 1 doesn't actually use $W_c$ as is, but rather uses its positive, sorted form to ensure a match is found in the library. The constructed H-function is then converted back to original form using negations to ensure functional equivalence.

When a cut is replaced by its decomposed form involving a DTG and glue logic, not only some logic is eliminated but also a positive slack is created at the nets in the cut. The elimination of logic coupled with slacks brings about reduction in the area of overall circuit.

Suppose Δ denotes the delay of the combinational part in the cut. If $S_F$ denotes setup time of a flipflop, then the required time at the nets in the cut is P–$S_F$–Δ, where P is the clock period.

if $S_T$ denotes the setup time of the DTG, $Δ_g$ denotes the delay of the g-functions at the input of DTG, then the new required time at the nets of the cut is P–$S_T$–$Δ_g$. Since the arrival time is determined by the cone of logic that feeds the cut (it reduces due to lower load however we are assuming the worst case), and therefore remains the same before and after replacing a cut by the DTG, the difference in slacks ($Δ_S$) equals the difference between new and previous required times.

$$Δ_S = S_F + Δ - S_T - Δ_g \quad (14)$$

In order to maximize $Δ_S$, we observe that $Δ_g$ (the overhead due to g-functions) should be as small as possible while the delay of the cut (Δ) that was decomposed should be as large as possible. By design, all the DTG cells have negative setup time i.e. $S_T<0$. If $Δ_g<Δ+S_F-S_T$ then the slack is positive.

In the current DTG library, each input of a DTG cell has very low input capacitance. This capacitance is about 10% of the input capacitance of the smallest D-flipflop in a commercial 65 nm low power library. Therefore the combinational gates driving the DTGs have comparatively smaller loads. The clock to output delay of the DTG cells is comparable to that of the D-flipflop and is similar for all DTGs. Consequently the timing burden on the combinational logic driven by the DTG (which is referred to as the fed circuit) is constant.

The reliability issues are taken care of by sizing the transistors in all the cells appropriately so that none of the cells exhibit any errors for 1000 monte-carlo simulations at 1.0V and Fast-Slow corner at −40 deg C. In fact, lower cells such as DTG-3, DTG-5 and DTG-7 show no errors even at 0.8V.

The cut enumeration and the threshold decomposition modules were implemented in C++. The upper bound on the cut size was set to 7 in order to keep the runtime small. If the given netlist consists of complex logic cells then the structural enumeration of cuts produces very few decomposable cuts or possibly none at all. Therefore every complex cell in the input circuit is internally converted into equivalent NAND gates representation in order to maximize the number of decomposable cuts.

Experiments were conducted on fairly large circuits (in contrast to ISCAS type benchmarks). These include 32-bit multiplier, FIR filter, a MAC unit and a 32-bit MIPS ALU. The circuit Multiplier is a manually designed 2 stage 32 bit Wallace-Tree multiplier. The ALU is a 32-bit integer circuit implementing arithmetic operations in MIPS instruction set. The filter is a 28-bit, 4 tap FIR filter. The tap weights were randomly chosen and kept constant throughout the experiments. The MAC is a single stage 32-bit multiplier accumulator unit.

For both the conventional CMOS design and the hybrid design, Cadence RTL compiler was used for the synthesis, and the place and route of the synthesized circuits was carried out using Cadence Encounter. The conventional CMOS version and the hybrid synthesized netlists are placed and routed with the signal integrity checks activated, extracted as spice netlist. The PVT corner used for all experimentation was slow-slow (SS) at 105° C. with supply voltage of 1.1 V and the MOS models used in spice simulation were standard $V_{th}$ (SVT) models. The area densities post place and route were matched as closely as possible for CMOS and Hybrid version of a given circuit for fair comparison of total area. The final area densities of the different circuits considered ranged between 70-80%.

Table 1 shows the LEF area (post place and route area) comparison of the CMOS and the hybrid circuits.

TABLE 1

Area and Total Capacitance Reduction

| Circuit | Area (mm²) | | | Total Circuit Cap (pF) | | |
|---|---|---|---|---|---|---|
| | CMOS | Hybrid | % Δ | CMOS | Hybrid | % Δ |
| MAC | 0.062 | 0.039 | 38 | 111 | 62 | 45 |
| Multiplier | 0.085 | 0.067 | 22 | 120 | 85 | 29 |
| Filter | 0.175 | 0.123 | 30 | 287 | 167 | 42 |
| ALU | 0.043 | 0.038 | 12 | 71 | 58 | 18 |

Table 2 shows the results of reduction in dynamic and leakage power. The total power was measured by applying random input vectors using nanosim (a fast spice simulator by Synopsys). Identical vector inputs were applied to both CMOS and Hybrid circuits. The leakage power was measured by bringing both CMOS and Hybrid circuits into a fixed state and then turning off the clock and measuring total power consumed by the supply. The reduction in leakage power arises from reduction in combinational logic in terms of cell count as well as sizes. The reason that the leakage power is not a significant component of the total power is that the libraries used in the experiments were 65 nm low power process libraries (LP). The general purpose (GP) libraries typically used in commercial circuits have much higher leakage. The improvement in the leakage power in hybrid circuits should matter significantly in GP circuits.

TABLE 2

Dynamic and Static Leakage Power Reduction (SS, 105 C, 1.1 V with Cells Having 0 Failures in 1000 Monte Carlo Simulations

| Circuit | Dynamic Power (mW) | | | Leakage Power (uW) | | |
|---|---|---|---|---|---|---|
| | CMOS | Hybrid | % Δ | CMOS | Hybrid | % Δ |
| MAC | 30.5 | 19.3 | 36 | 16.3 | 8.1 | 50 |
| Multiplier | 43.3 | 32.8 | 24 | 17.6 | 9.3 | 48 |
| Filter | 70.9 | 55.4 | 22 | 52.9 | 29.6 | 45 |
| ALU | 13.9 | 11.7 | 16 | 7.8 | 5.6 | 29 |

Figure 6:
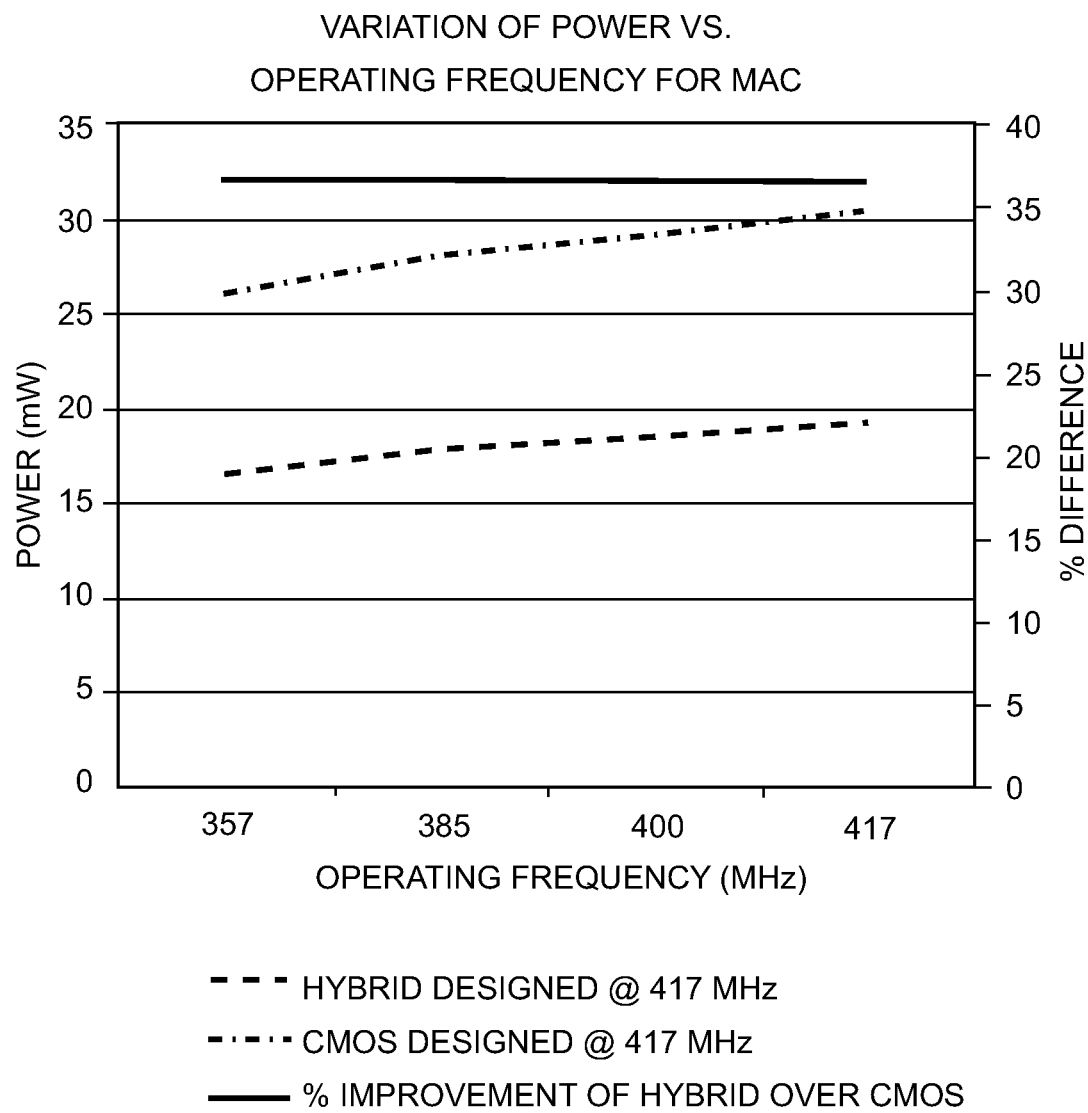
FIG. 6 illustrates a graph of power variation versus operating frequency for a multiplier-accumulator (MAC) architecture designed in accordance with threshold decomposition, and for another MAC architecture designed with typical logic gates.

The design frequency refers to the frequency at which a circuit is synthesized and laid out by tools. The circuit can run no faster than design frequency (assuming no slacks are left out). The operating frequency is the actual frequency at which the resultant circuit is simulated. Naturally the design frequency is the highest possible value of operating frequency. It is easy to see that any advantages seen at a given design frequency are maintained for any operating frequency. This means that a hybrid multiplier showing 25% improvement in power at peak operating frequency of 666 MHz will show same 25% improvement in power if both the circuits were run at 300M Hz. FIG. 6 shows the plot of power improvement at various operating frequencies for MAC circuit. The line named % improvement of Hybrid over CMOS (see secondary y-axis on the right for its values. The values are in percentages) is almost constant over the range of operating frequencies.

Figure 7:
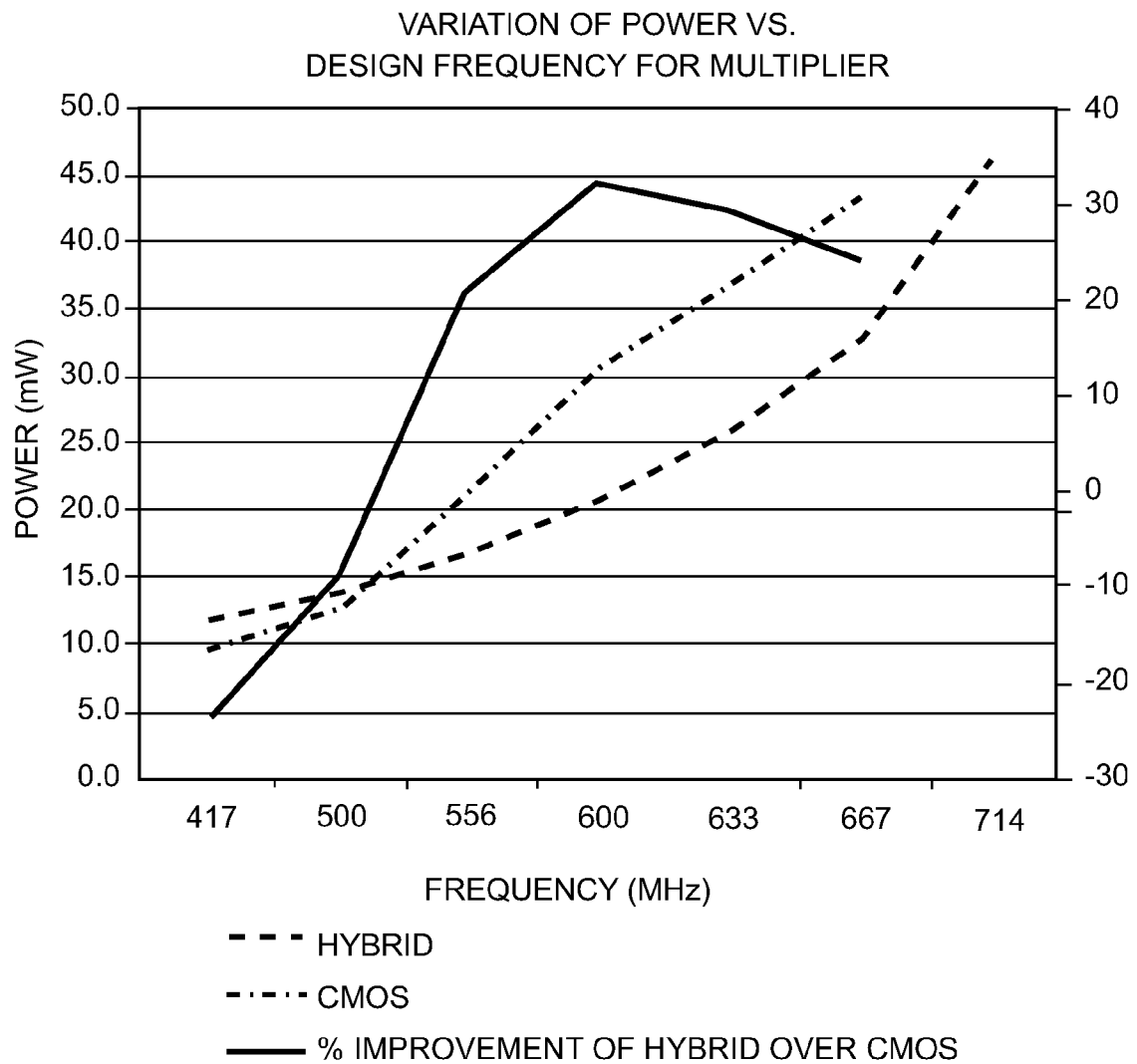
FIG. 7 illustrates a graph of power variation versus operating frequency for a multiplier architecture designed in accordance with threshold decomposition, and for another multiplier architecture designed with typical logic gates.

This is however not true for design frequency. When design frequency is varied, the synthesis and place and route tools adopt different strategies in order to create smaller and low power circuits. For example at lower design frequencies, synthesizer can use a ripple carry adder instead of carry look-ahead adder, reducing total number of gates and therefore area/power. FIG. 7 shows the variation of power for CMOS and Hybrid multiplier circuits with regard to design frequencies.

The line labeled % improvement of Hybrid over CMOS shows a decreasing trend after reaching peak implying that as design frequency reduces the advantages diminish. The initial increase in the trend can be attributed to the fact that at very high frequencies, the optimization of CMOS as well as hybrid is usually far from optimal resulting in larger gate counts for both circuits.

It should be noted that commercial synthesizer tool performs synthesis of CMOS circuits here directly from a high level description such as verilog RTL. At low frequencies, it can very well optimize a good verilog code. A hybrid circuit, on the other hand, is a gate level representation and obviously harder to optimize than CMOS. Additionally at very low frequencies, the slacks imparted by DTG cells are no longer absorbed (The gates are already minimum sized). Due to these reasons, the improvement starts decreasing at low end of frequencies.

Figure 8:
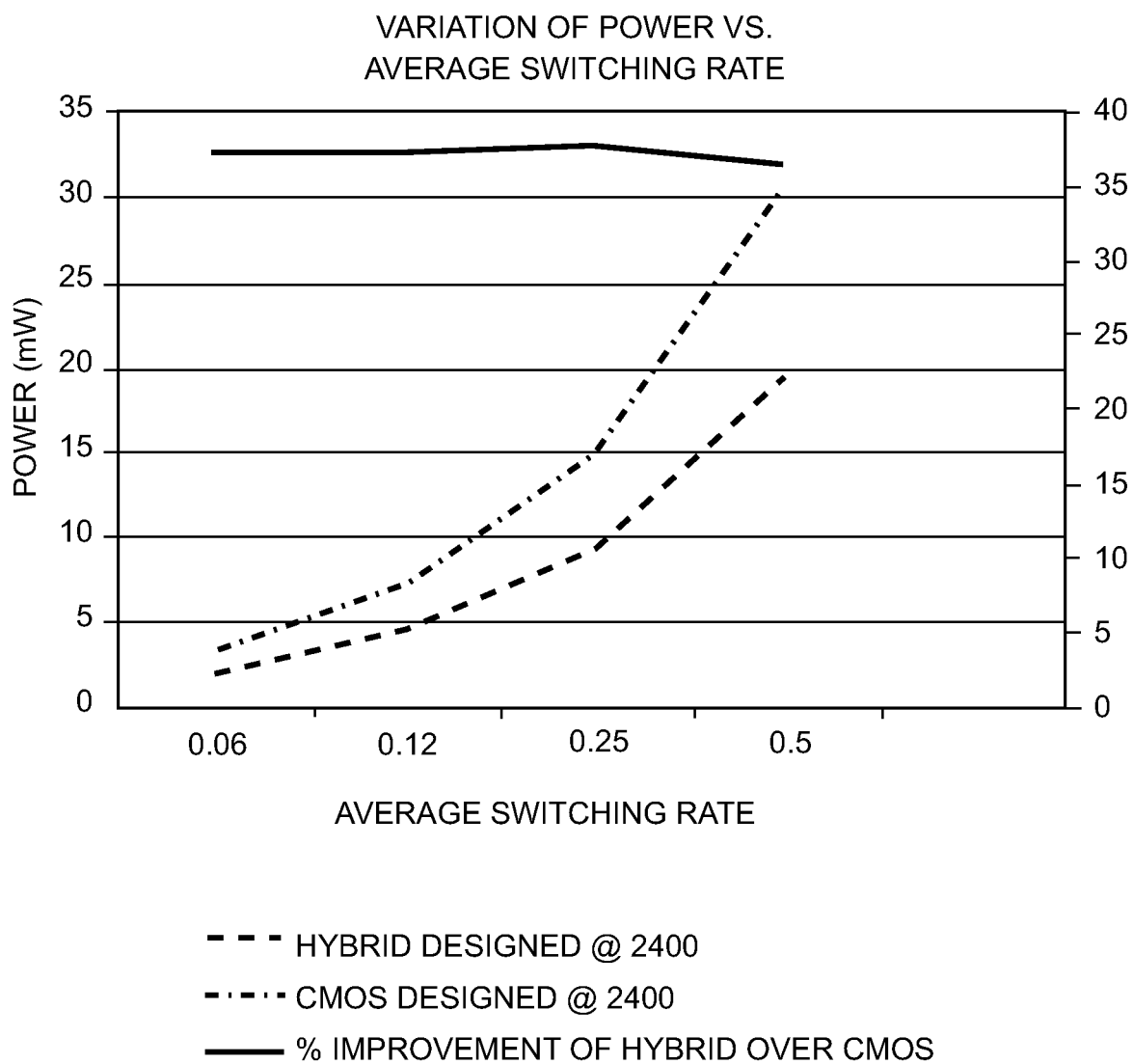
FIG. 8 illustrates a graph of power variation versus average switching rate for a MAC architecture designed in accordance with threshold decomposition, and for another MAC architecture designed with typical logic gates.
Figure 9A:
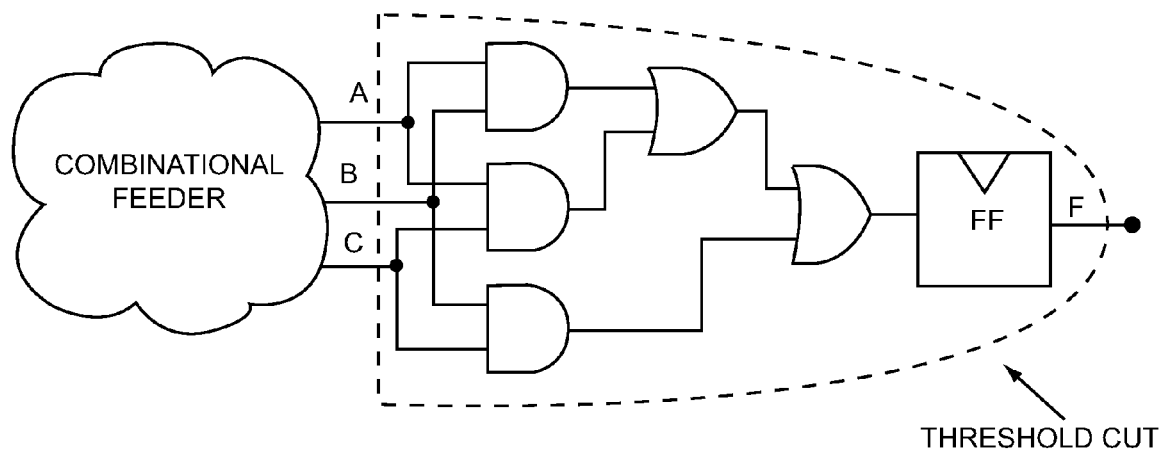
FIGS. 9A and 9B illustrate a visual example of a cut and of a threshold logic latch (TLL) cell being mapped to the cut.
Figure 9B:
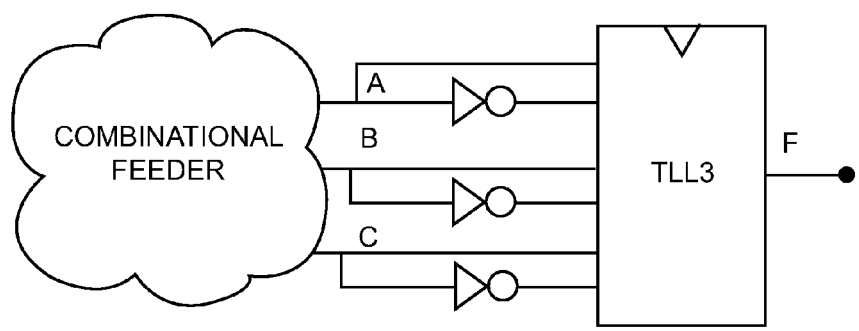

The average switching rate of all the primary inputs used in the nanosim simulations of all circuits was set to 0.5 which is quite high for practical scenarios. Therefore we varied average switching rate in Nanosim simulations and measured power improvements for MAC. FIG. 8 shows that the switching rate does not significantly affect the improvements obtained.

Threshold logic is emerging as an attractive alternative to the conventional Boolean logic. As described herein, DTG cells implementing threshold logic functions can be used to significantly reduce the total power of the sequential CMOS circuits without sacrificing performance. From the results, we observe that the circuits where effect of DTG delay is least seen by CMOS logic are benefited more in terms of area and power. Decreasing DTG delay and improvements in usage of DTG through different ways will certainly bring further power and area advantage. These concepts are considered to be within the scope of the present disclosure.

The library of the DTG cells and the hybridization method described herein are geared towards minimizing the extra overhead in the existing VLSI design flow. In fact all the results were generated with the help of existing commercial tools such as Cadence RTL compiler and Cadence Encounter. Therefore it is hoped that the hybrid circuits will soon become mainstream and more elaborate literature on the threshold logic will follow. In fact, DTGs are placed such that output of flipflop and DTG are identical which helps maintain "state" of the original circuit. This eliminates any additional changes in the testing framework when circuit is hybridized.

Although this work has focused on a specific way of mapping of the DTG cells, there exist several ways that may be used to produce hybrid circuits, all of which are considered to be within the scope of the present disclosure. For example, if retiming were allowed (essentially we change the state encoding of original circuit) then it is possible to strategically replace most threshold functional blocks of circuit resulting in significant advantages. Another useful piece of work consists of being able to identify and replace standard blocks of logic (directly in the RTL description) with equivalent but faster and low power DTG cell blocks.

Figure 10A:
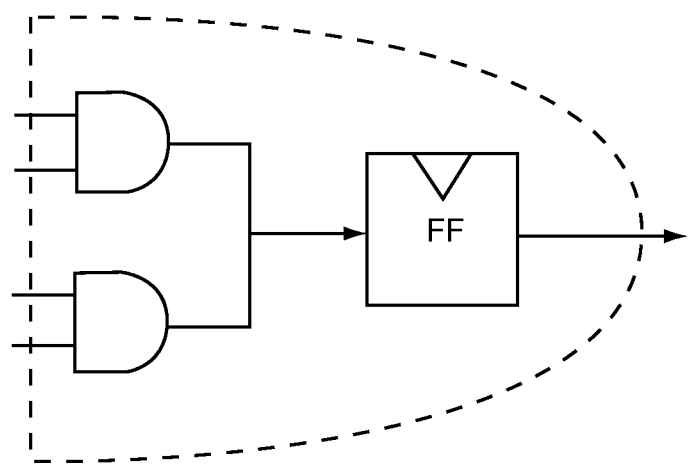
FIGS. 10A and 10B illustrate a visual example of forward replacement and backward replacement.
Figure 10B:
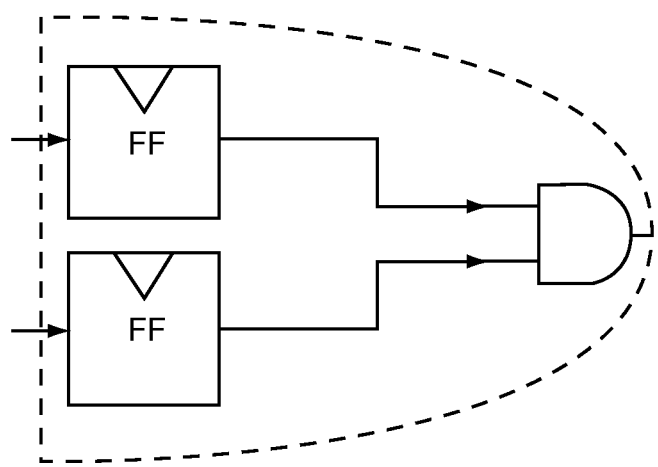
Figure 11:
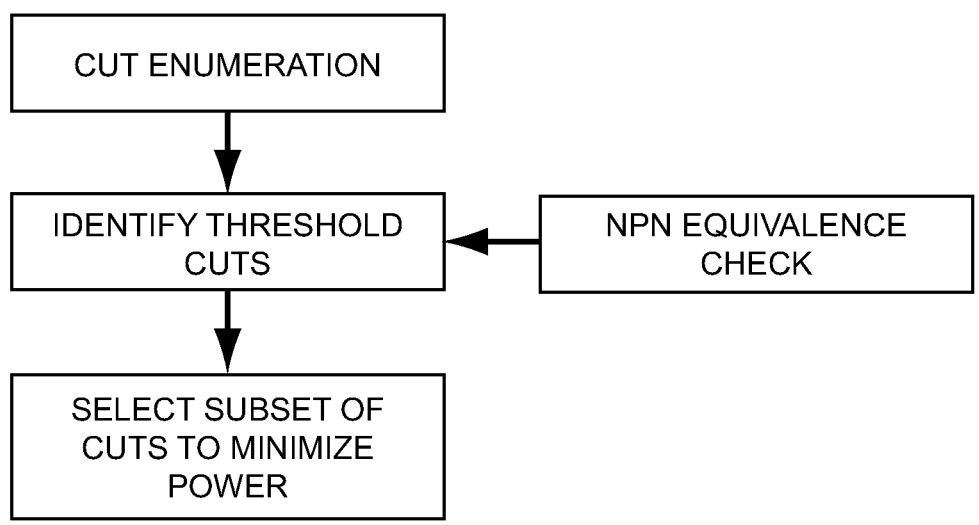
FIG. 11 illustrates steps in one embodiment of a method for mapping using the TLL cells.
Figure 12:
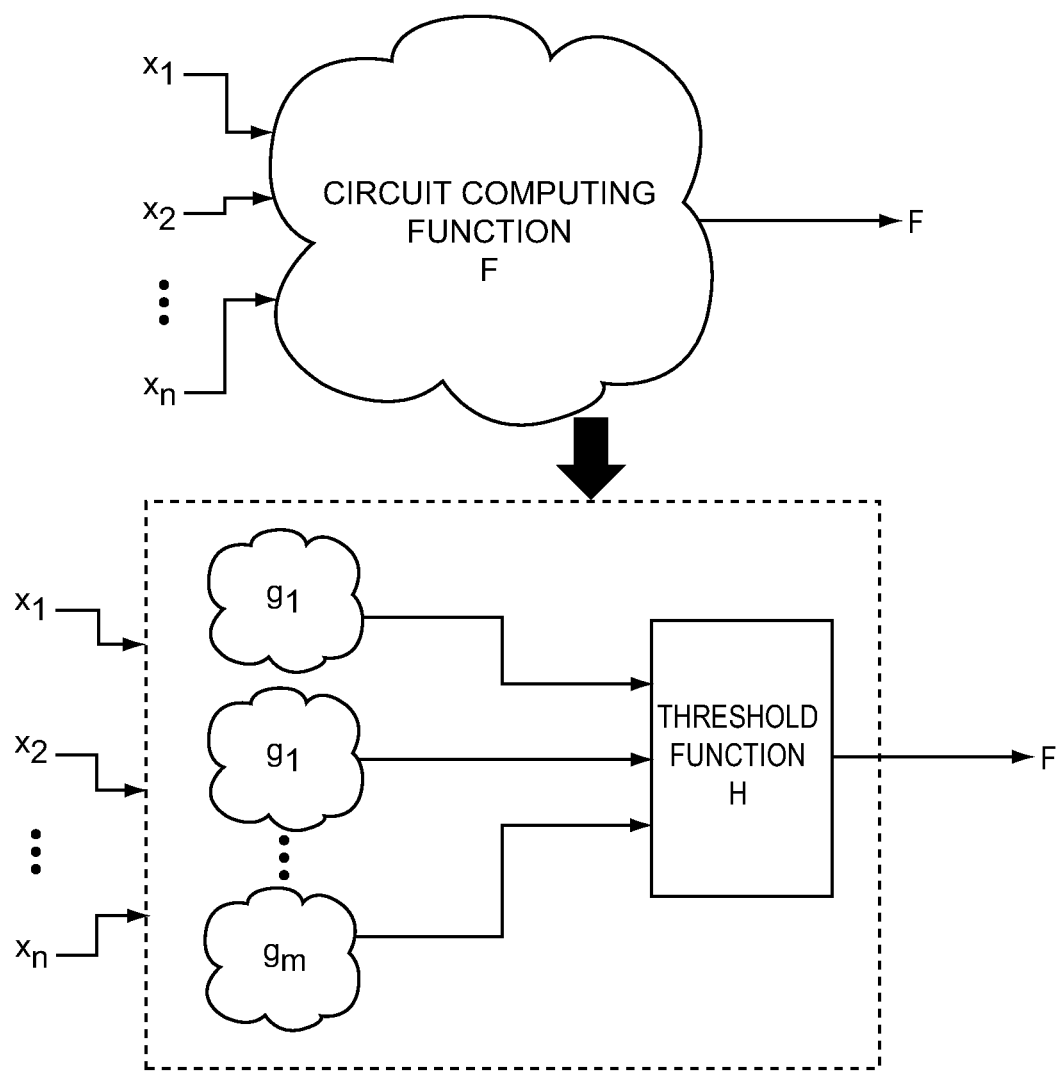
FIG. 12 illustrates a visual example of function decomposition for a circuit computing function.
Figure 13:
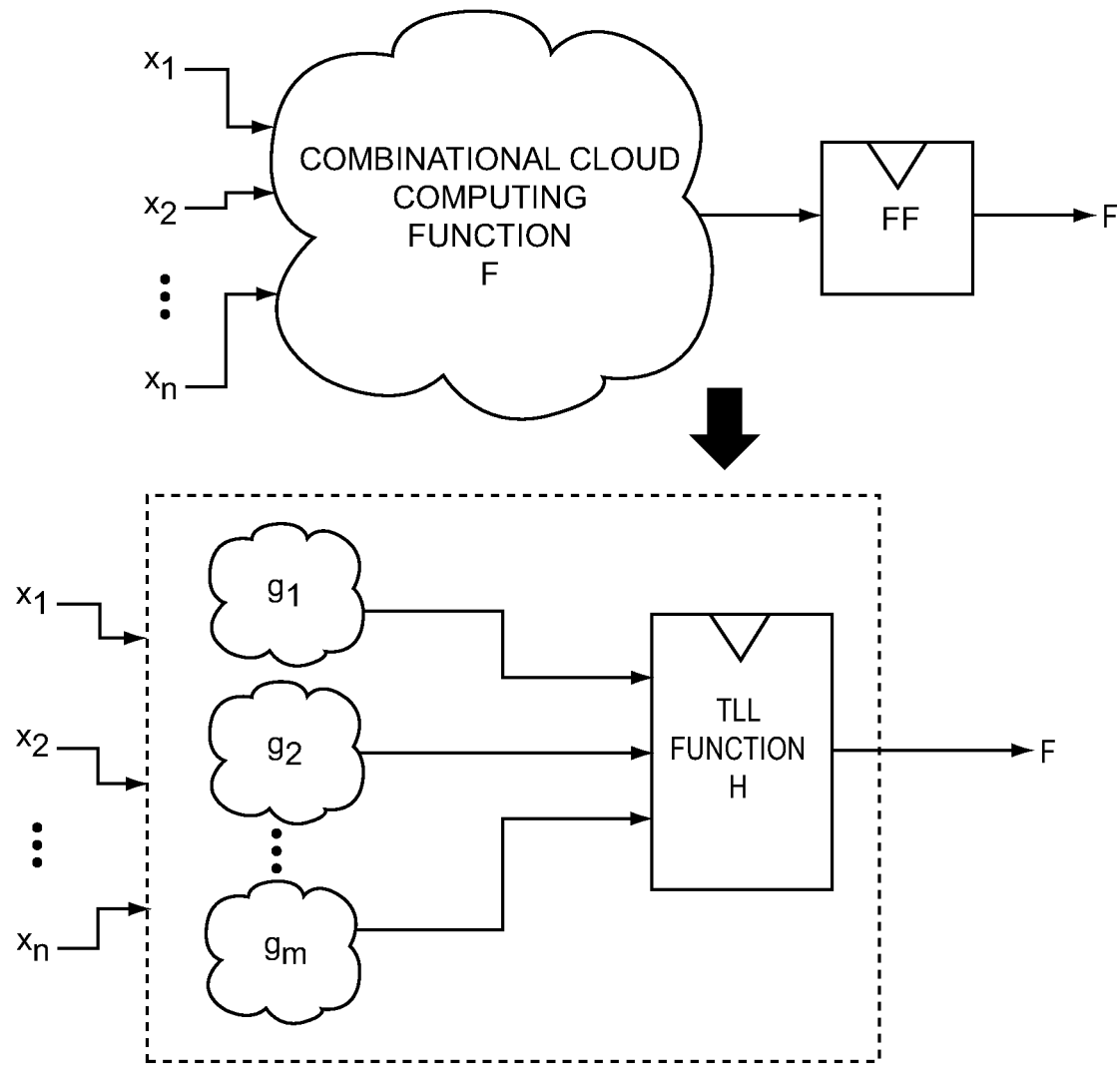
FIG. 13 illustrates a visual example of backward function decomposition for a circuit computing function.
Figure 14:
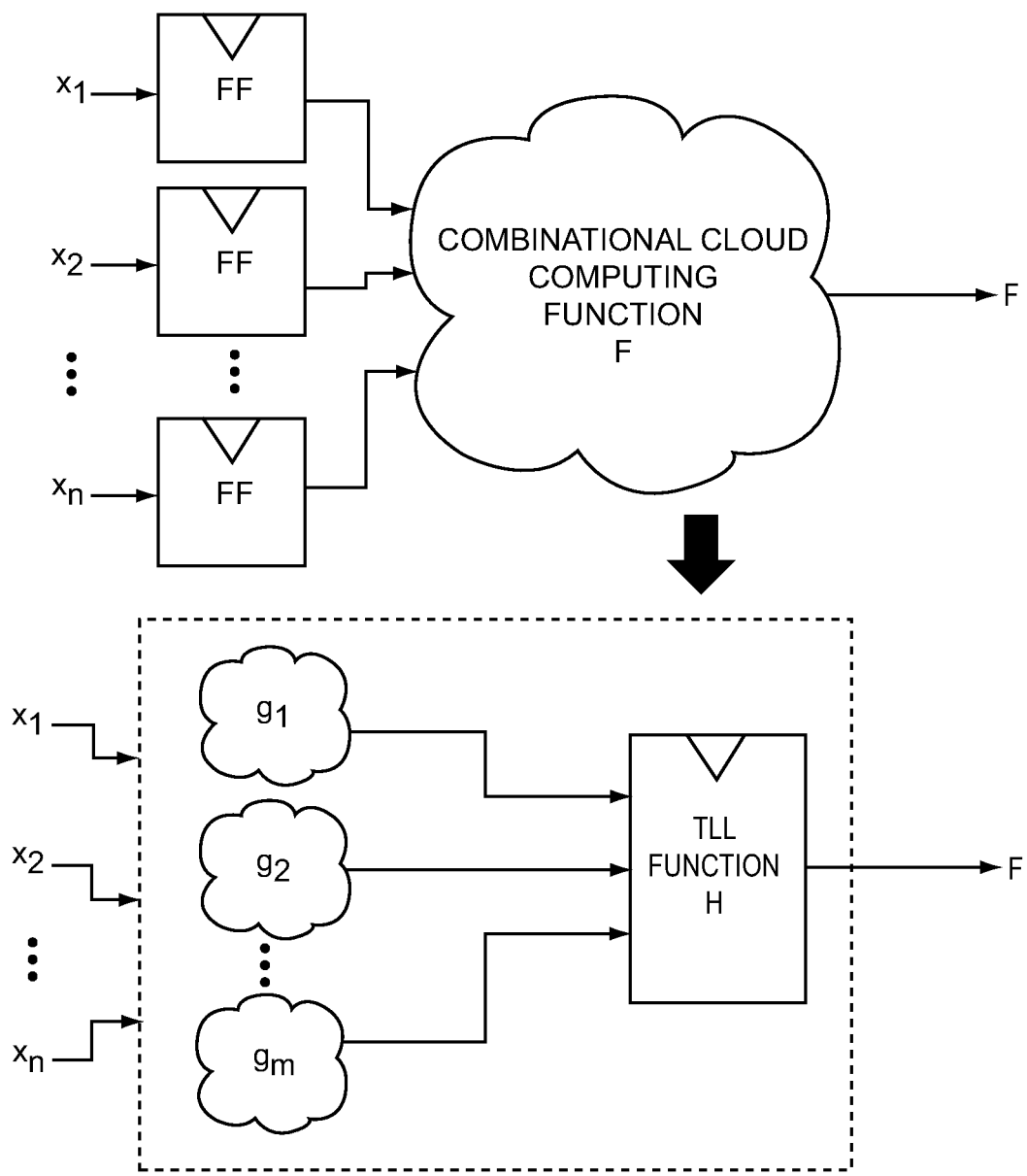
FIG. 14 illustrates a visual example of forward function decomposition for a circuit computing function.
Figure 15:
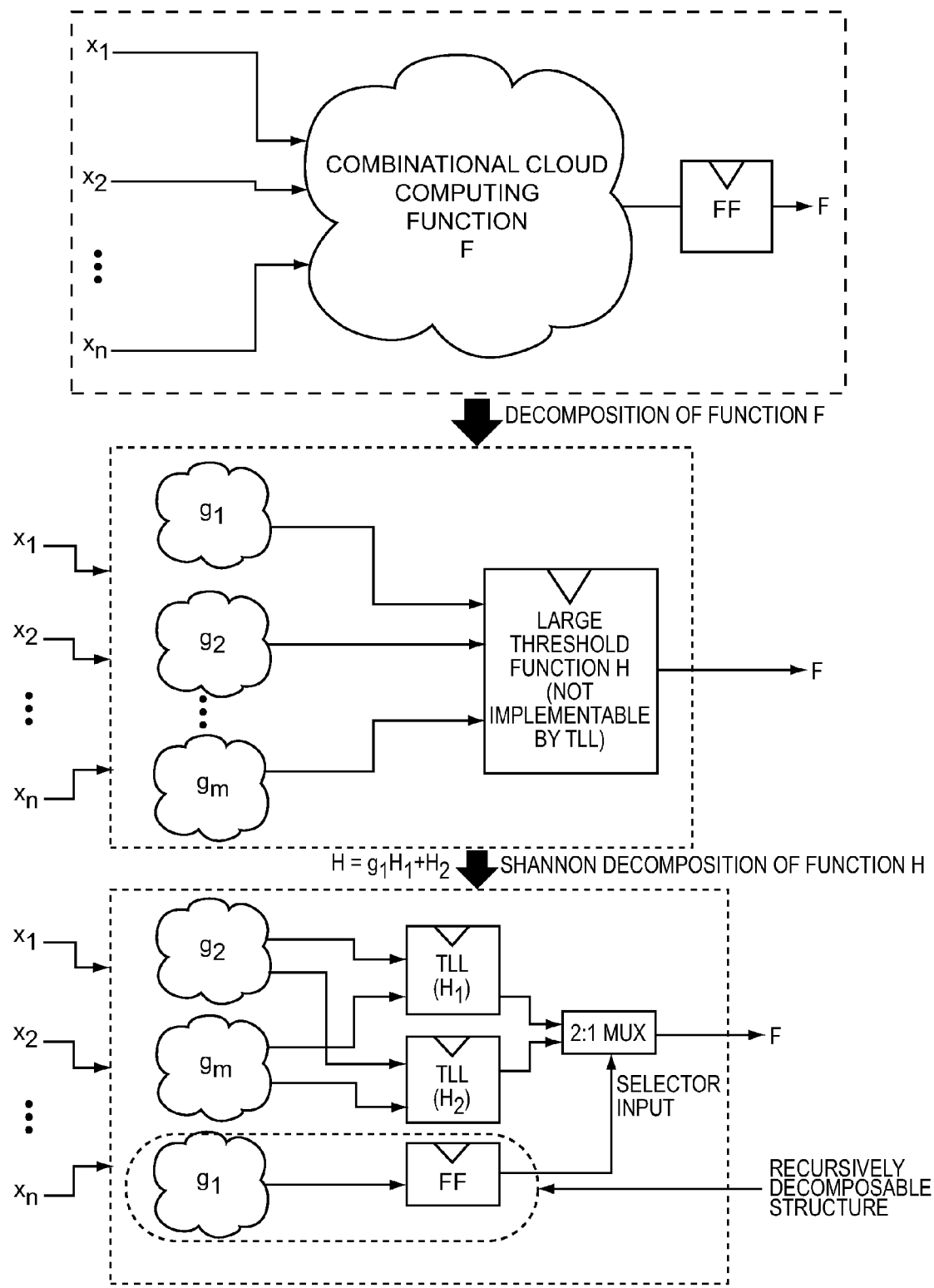
FIG. 15 illustrates visual examples of different decompositions that may be implemented during recursive function decomposition for a circuit computing function.

However note that there exist multiple ways to embed a TLL in a circuit. This is shown in FIGS. 10A and 10B. Although the description below only focuses on the type of mapping as shown in FIG. 10A, those skilled in the art will recognize alternate embedding methods and mapping types, all of which are considered within the scope of the present disclosure.

Even if a choice is made to restrict the mapping to a backward replacement, many choices can still exist for the subcircuits that can be replaced by a TLL cell. FIGS. 10A and 10B show the examples of such subcircuits or cuts. The present disclosure is not limited thereto. The choice of a specific cut dictates the amount of logic absorbed, the TLL cell to be used and also the timing slacks generated in the cone. The process of hybridization essentially consists of identifying the cuts in each cone and replacing them with a TLL. Depending on which cuts are selected, the circuit can be optimized for power.

Although this disclosure has focused on a specific way of mapping of the TLL cells, there exist different ways (or some combinations of them) that may be used to produce hybrid circuits having significantly smaller power as well as delay. There is also a scope to evaluate power-delay trade-offs in the hybridization and it is possible to derive an economic model to help design circuits based on delay and power requirements. All such modifications are considered within the scope of the present disclosure.

The methods to incorporate TLL cells in a CMOS network described in the present disclosure are collectively termed as hybridization.

A cut enumeration sub-procedure in hybridization may also enumerate cuts rooted at Boolean gates instead of those rooted at flipflops. The replacement of such cuts by DTG are called forward and backward replacements respectively. FIGS. 10A and 10B show the forward and backward replacement concepts pictorially.

In an alternate embodiment, the identification of a threshold function may be carried out using the ILP based method. The algorithm 1 still applies in this case since such identification is simply a sub-procedure of algorithm 1. Additionally, if a Don't Care (DC) set of a Boolean function is also available, then the identification of thresholdness using ILP can be modified to accommodate the DC set of the function F. The algorithm 1 still applies to this variant. The DC set of a Boolean function represents a set of input combinations that never occur at its inputs. This usually arises due to the properties of the circuit surrounding the cut whose function is F.

The common weight vector $W_c$ mentioned in the algorithm 1, can also be found using an ILP based method. All of these variants form part of the present disclosure.

The types of cuts enumerated by the cut enumeration procedure are typically those rooted at a flipflop as shown in FIG. 10A. The replacement of such cuts by an equivalent DTG circuit along with additional logic (if any) is called backward replacement. However an alternate replacement strategy called forward replacement as shown in FIG. 10B is also in purview of the present disclosure.

Those skilled in the art will recognize improvements and modifications to the present disclosure. All such improvements and modifications are considered within the scope of the concepts disclosed herein.

What is claimed is:

1. A method of mapping threshold gate cells into a Boolean network called a hybridization, comprising:
   enumerating cuts within the Boolean network;
   representing, using a computer, a Boolean function of each of the cuts with at least a differential mode threshold logic gate using disjoint Boolean function based decomposition for threshold functions; and
   selecting a subset of the cuts to use in order to minimize power or area.

2. The method of claim 1 wherein one or more of the cuts within the Boolean network are rooted at a flipflop.

3. The method of claim 1 wherein representing the Boolean function of each of the cuts comprises replacing the cuts with the at least the differential mode threshold logic gate using backward replacement.

4. The method of claim 1 wherein representing the Boolean function of each of the cuts comprises replacing the cuts with the at least the differential mode threshold logic gate using forward replacement.

5. The method of claim 1 wherein one or more of the cuts within the Boolean network is rooted at a Boolean gate.

6. The method of claim 1 wherein for each of the cuts, replacement of the each of the cuts leads to addition of a flipflop, wherein the flipflop, along with a fanin logic cone for the flipflop, is recursively hybridizable.

7. The method of claim 1 wherein each of the cuts is at least partially implementable with a threshold function.

8. The method of claim 1 further comprising identifying a threshold function by performing Integer Linear Programming (ILP).

* * * * *